(12) United States Patent
Dickson

(10) Patent No.: US 7,219,289 B2
(45) Date of Patent: May 15, 2007

(54) MULTIPLY REDUNDANT RAID SYSTEM AND XOR-EFFICIENT METHOD AND APPARATUS FOR IMPLEMENTING THE SAME

(75) Inventor: Lawrence John Dickson, National City, CA (US)

(73) Assignee: Tandberg Data Corporation DE (US)

( * ) Notice: Subject to any disclaimer, the term of this patent is extended or adjusted under 35 U.S.C. 154(b) by 178 days.

(21) Appl. No.: 11/080,093

(22) Filed: Mar. 15, 2005

(65) Prior Publication Data
US 2006/0218470 A1    Sep. 28, 2006

(51) Int. Cl.
G06F 11/10 (2006.01)
H03M 13/13 (2006.01)

(52) U.S. Cl. .................. 714/752; 714/759; 714/770

(58) Field of Classification Search ............. 714/752, 714/770, 759
See application file for complete search history.

(56) References Cited

U.S. PATENT DOCUMENTS

| | | | |
|---|---|---|---|
| 4,142,174 A | | 2/1979 | Chen et al. |
| 4,763,332 A | * | 8/1988 | Glover .................. 714/756 |
| 4,782,490 A | * | 11/1988 | Tenengolts .............. 714/756 |
| 5,285,455 A | | 2/1994 | Tong et al. |
| 5,333,143 A | | 7/1994 | Blaum et al. |
| 5,473,620 A | * | 12/1995 | Zook et al. .............. 714/785 |
| 5,579,475 A | | 11/1996 | Blaum et al. |
| 6,012,159 A | * | 1/2000 | Fischer et al. .......... 714/755 |
| 6,557,123 B1 | | 4/2003 | Wiencko et al. |
| 6,678,855 B1 | * | 1/2004 | Gemmell ............... 714/752 |
| 6,694,479 B1 | | 2/2004 | Murthy et al. |
| 2004/0117718 A1 | * | 6/2004 | Manasse ................. 714/781 |

OTHER PUBLICATIONS

Lacan et al., "Systematic MDS Erasure Codes Based on Vandermonde Matrices", IEEE Communications Letters, vol. 8, No. 9, Sep. 2004, pp. 570-572.*
1. M. Blaum, J. Brady, J. Bruck and J. Menon: "EVENODD: An Optimal Scheme for Tolerating Double Disk Failures in RAID Architectures". IEEE, 1994, pp. 245-254. 1063-6897/94.
2. M. Blaum, J. Bruck and A. Vardy: "MDS Array Codes with Independent Parity Symbols." IEEE Trans. Information Theory, vol. 47, No. 2, Mar. 1996, pp. 529-542.

(Continued)

Primary Examiner—Stephen M. Baker
(74) Attorney, Agent, or Firm—Chen Yoshimura LLP

(57) ABSTRACT

An improved and extended Reed-Solomon-like method for providing a redundancy of $m \geq 3$ is disclosed. A general expression of the codes is described, as well as a systematic criterion for proving correctness and finding decoding algorithms for values of $m \geq 3$. Examples of codes are given for m=3, 4, 5, based on primitive elements of a finite field of dimension N where N is 8, 16 or 32. A Horner's method and accumulator apparatus are described for XOR-efficient evaluation of polynomials with variable vector coefficients and constant sparse square matrix abscissa. A power balancing technique is described to further improve the XOR efficiency of the algorithms. XOR-efficient decoding methods are also described. A tower coordinate technique to efficiently carry out finite field multiplication or inversion for large dimension N forms a basis for one decoding method. Another decoding method uses a stored one-dimensional table of powers of $\alpha$ and Schur expressions to efficiently calculate the inverse of the square submatrices of the encoding matrix.

39 Claims, 7 Drawing Sheets

OTHER PUBLICATIONS

3. M. Blaum, J. Brady, J. Bruck, J. Menon and A. Vardy: "The EVENODD Code and its Generalization: An Efficient Scheme for Tolerating Multiple Disk Failures in RAID Architectures", Chapter 8, "High Performance Mass Storage and Parallel I/O: Technologies and Applications", H. Jin, T. Cortes and R. Buyya, Eds., IEEE Computer Society Press and Wiley, 2001.

4. F. MacWilliams and N. Sloane, The Theory of Error-Correcting Codes, pp. 317-331, North-Holland 1977.

5. J. Sankaran : "Reed Solomon Decoder: TMS320C64x Implementation", Application Report SPRA686, Texas Instruments, Dec. 2000.

6. P. Scott, S. Tavares and L. Peppard, A Fast VLSI Multiplier for GF(2m), IEEE J. Selected Areas In Communications, vol. SAC-4, No. 1, 62-66, Jan. 1986.

7. H. Anvin, The mathematics of RAID-6, Dec. 1, 2004, http://kernel.org/pub/linux/kernel/people/hpa/raid6.pdf.

8. K. Aoki and K. Ohta, Fast Arithmetic Operations Over F2n for Software Implementation, SAC '97, 1997, www.scs.carleton.ca/~sac97/program/FinalPapers/paper24.ps.

9. C. Ko and T. Acar, Montgomery multiplication in GF(2k), Designs, Codes and Cryptography, 14 (1998), 57-69, http://islab.oregonstate.edu/papers/j47mmugf.pdf.

10. Intel(R) 80333 I/O Processor Developer's Manual, pp. 409-488, Mar. 2005, http://download.intel.com/design/iio/manuals/30543201.pdf.

11. P. Hsieh, I. Chen, Y. Lin and S. Kuo, An XOR Based Reed-Solomon Algorithm for Advanced RAID Systems (Abstract), Defect and Fault Tolerance in VLSI Systems, 19th IEEE International Symposium on (DFT'04), Oct. 10-13, 2004, http://csdl2.computer.org/persagen/DLAbsToc.jsp?resourcePath=/dl/proceedings/dft/&toc=comp/proceedings/dft/2004/2241/00/2241toc.xml&DOI=10.1109/DFT.2004.10

12. C. Park and Y. Han, A Practical Parity Scheme for Tolerating Triple Disk Failures in RAID Architectures, Advances in Computer Science—ASIAN 2000, pp. 58-68, J. He and M. Sato (Eds.), Springer 2000.

13. M. Cohen and C. Colbourn, Steiner Triple Systems as Multiple Erasure Correcting Codes in Large Disk Arrays, 2000 Int. Conf. on Performance, Computing and Communications 288-294, 2000.

14. C. Tau and T. Wang, Efficient Parity Placement Schemes for Tolerating Triple Disk Failures in RAID Archetecture, Proc. of the 17th Int. Conf. on Advanced Information Networking and Applications (AINA .03), 0-7695-1906-7/03, 2003.

* cited by examiner

US 7,219,289 B2

MULTIPLY REDUNDANT RAID SYSTEM AND XOR-EFFICIENT METHOD AND APPARATUS FOR IMPLEMENTING THE SAME

BACKGROUND OF THE INVENTION

1. Field of the Invention

This invention relates to method and apparatus for providing a multiply redundant RAID system.

2. Description of the Related Art

RAID (Redundant Array of Independent Disks) is a data storage system that employs two or more disk drives (or storage devices in general) and delivers fault tolerance and performance. RAID architectures that can tolerate multiple disk failures (i.e. multiply redundant) are known. One such system is described in Wiencko et al., "Data Redundancy Methods and Apparatus", U.S. Pat. No. 6,557,123, filed 2 Aug. 1999, issued 29 Apr. 2003, assigned to the assignee of the present disclosure, which describes a method for encoding data that protects against simultaneous m disk failures in an array of n disks, as well as a code discovery method. Other methods for double- or triple-disk failure protection are also known; one category of such methods uses Reed-Solomon or Reed-Solomon-like codes.

Reed-Solomon (R-S) error correction is a coding scheme which works by first constructing a polynomial from the data symbols to be transmitted and then sending an over-sampled plot of the polynomial instead of the original symbols. (See Wikipedia: "Reed-Solomon error correction", http://en.wikipedia.org/wiki/Reed-Solomon_error_correction.) Thus, a matrix for a massively over-sampling R-S on two symbols (matrix on the right notation and linear polynomials) would be $$\text{code}((xy)) = (xy)\begin{pmatrix} 1 & 1 & 1 & & 1 \\ & & \cdots & & \\ \alpha & \beta & \gamma & & \chi \end{pmatrix} \quad (1)$$

where $\alpha, \beta, \gamma, \ldots \chi$ are n distinct values in some finite field. If $\alpha$ is primitive and a generator of the multiplicative group, and the number of coded values (matrix columns) is less than the order of the field, then one may have $\beta = \alpha^2$ $\gamma = \alpha^3$ and so forth: this leads to straightforward algorithms (Berlekamp) for solving for errors. The coding of (1) is called "non-systematic" because nowhere among the entries to code((x y)) do x or y themselves necessarily appear. To get a systematic code, one for which the data appears in clear form among the coded values, one may multiply the matrix on the left by a 2×2 matrix that forces the left two columns to an identity matrix. But then, there is no simple expression for the matrix entries.

The above example has only two data points and n−2 parities. To increase the data dimension, add rows raising $\alpha$, $\beta$, $\gamma$, . . . to consecutive powers, and use Vandermonde. Realistic cases will sample n times in a polynomial of degree n−m−1, where m is comparatively small (perhaps 2 or 3) and n large (perhaps 15 or larger). This makes the solution expression more complicated, if a systematic code is desired.

A variant, which only needs to be mentioned here, is that found in Murthy et al., "Multiple Drive Failure Recovery for a Computer System having an Array of Storage Drives", U.S. Pat. No. 6,694,479. This uses a matrix like that found in (1), but as an implicit condition, requiring multiplication with a data/parity vector on the right of the matrix to give zero. For this variant, the data dimension would be n−2 and the parity dimension 2. It is easily extended (by Vandermonde) to parity greater than 2 by adding rows raising $\alpha$, $\beta$, $\gamma$, . . . to consecutive powers. This amounts to a "dual" form of standard Reed-Solomon.

Another algorithm has also been called "Reed-Solomon" (in Blaum et al., "EVENODD: An Optimal Scheme for Tolerating Double Disk Failures in RAID Architectures", IEEE, 1994, pp 245–254, 1063–6897/94, hereinafter [B2]), or "B-adjacent" (in Blaum et al., "Method and Means for B-Adjacent Coding and Rebuilding Data from up to Two Unavailable DASDs in a DASD Array", U.S. Pat. No. 5,333,143, hereinafter [B1]). It places the matrix like that found in (1) below an identity matrix and uses it to multiply by a data vector on the right, expressed as equation (2) below. This automatically gets a systematic code if it works. But Vandermonde, by itself, does not prove it works.

$$\text{code}\begin{pmatrix}\begin{pmatrix} x \\ y \\ \vdots \\ z \end{pmatrix}\end{pmatrix} = \begin{pmatrix} 1 & 0 & \cdot & \cdot & 0 \\ 0 & 1 & \cdot & \cdot & 0 \\ \cdot & \cdot & \cdot & \cdot & \cdot \\ \cdot & \cdot & \cdot & \cdot & \cdot \\ 0 & 0 & \cdot & \cdot & 1 \\ \zeta & \eta & \cdot & \cdot & \theta \\ \cdot & \cdot & \cdot & \cdot & \cdot \end{pmatrix}\begin{pmatrix} x \\ y \\ \vdots \\ z \end{pmatrix} = \begin{pmatrix} I \\ P \end{pmatrix}\begin{pmatrix} x \\ y \\ \vdots \\ z \end{pmatrix} \quad (2)$$

Here I is an identity matrix, and the parity matrix P has horizontal dimension equal to the vector to be encoded, and vertical dimension equal to the parity count (dimension of code vector minus dimension of vector that was encoded).

The requirement for a non-systematic expression of the form of (1) to give an erasure code, where any surviving set of code values of the count of the data values can be decoded, is for all square submatrices of maximal size of the matrix in (1) to be invertible. This is obvious in the case of equation (1) because they are Vandermonde.

The requirement for a systematic expression of the form of (2) to give an erasure code, where any surviving set of code values of the count of the data values can be decoded, is for all square submatrices of the parity matrix P to be invertible. This does not follow in general if maximal submatrices are Vandermonde.

However, if P in (2) is set equal to the row dimension 2 matrix in (1), and we require that $\alpha, \beta, \ldots$ be unequal and nonzero, then the stronger requirement that all square submatrices be invertible is satisfied. Namely, one just needs to prove it for 1×1 square submatrices, which are invertible if nonzero. This is the approach used in [B1] to obtain a redundancy 2 code. This Reed-Solomon-based method has sometimes been referred to as "RAID6". It is also the code used in [B2] as a foil to Evenodd, and in [B2] it is called "Reed-Solomon". In the present disclosure it is referred to as "Reed-Solomon-like".

SUMMARY OF THE INVENTION

The present invention is directed to a coding method apparatus that substantially obviates one or more of the problems due to limitations and disadvantages of the related art.

An object of this invention is to provide an efficient, high-redundancy erasure code and data encoding method usable for general arrays, including very large arrays.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

An improved and extended Reed-Solomon-like method for providing a redundancy of $m \geq 3$ is described. A general expression of the codes is described (see equations (2a), (3)), as well as a systematic criterion for proving correctness and finding decoding algorithms for values of m greater than 2. Examples of codes are given for m=3, 4, 5, based on primitive elements of a finite field FN of dimension N over the field of two elements (also known as the "bit field") where N is 8, 16 or 32. In addition, a method is described using a base power s of the primitive element $\alpha$ to further increase calculation efficiency.

A Horner's method and accumulator apparatus are described for XOR-efficient evaluation of polynomials with variable vector coefficients and constant sparse square matrix abscissa. This method is easily used for large dimensions, allowing, in particular, for low gate count and low XOR count operations on large finite fields. It is particularly suitable for application to parity generation for Reed-Solomon-like multiple redundancy RAID algorithms.

XOR-efficient decoding methods are also described. One decoding method uses a tower coordinate technique to efficiently carry out finite field element calculations for large N. Another decoding method uses a stored one-dimensional table of powers of $\alpha$ and Schur expressions to efficiently calculate the inverse of the square submatrices of the encoding matrix. These two methods may be used in conjunction with each other.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
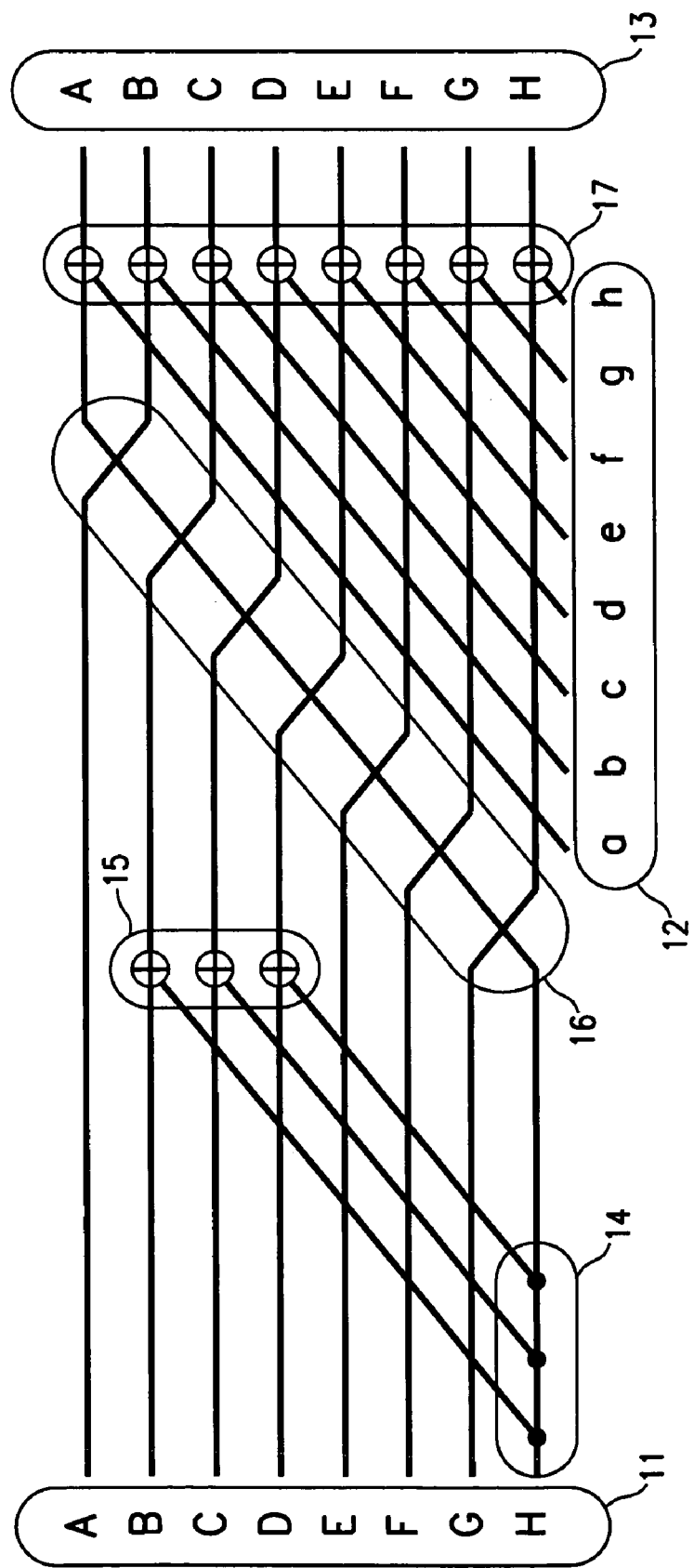
FIGS. 1–4 illustrate Horner's accumulators according to embodiments of the present invention.

Embodiments of this invention provide an efficient, high-redundancy erasure code and data encoding method usable for general disk arrays, including very large arrays. In this disclosure, "disk" should be generally understood to mean any suitable storage devices. Several conditions are desirable for an efficient algorithm: The algorithms should preferably be (a) space-optimal, (b) seek-optimal and (c) stripe-size-minimal for a given value of n (total disks) and m (redundancy, or the maximum number of disks that may simultaneously fail without any loss of user data). Condition (a) means that they must encode n–m disks worth of virtual data, recovering all the data from any n–m surviving disks. Condition (b) means that each data entry must affect parity on exactly m other disks (the Singleton bound). Condition (c) means that each data/parity stripe must intersect each disk in exactly one chunk. Here the bit size of a "chunk" is preferably a power of 2. A "data/parity stripe" is the minimum self-contained unit of data and parity that (from an encoding and decoding point of view) is completely independent of all other data and parity. Here, "self-contained" is normally taken to include a requirement for computational efficiency, so that for example the stripe and indeed the chunk may consist of a number of physical or logical disk sectors.

By contrast, the Evenodd scheme described in [B2] and Blaum et al., "Method and Means for Encoding and Rebuilding the Data Contents of up to Two Unavailable DASDs in a DASD Array using Simple Non-Recursive Diagonal and Row Parity", U.S. Pat. No. 5,579,475, and the codes described in U.S. Pat. No. 6,557,123 ("the Wiencko codes") are space-optimal. Wiencko codes are sometimes seek-optimal and sometimes not, and Evenodd is not seek-optimal. Both Wiencko codes and Evenodd are very far from being stripe-size-minimal. The stripe size intersection for Wiencko code disks is n/gcd(n,m) chunks, and the stripe size intersection for Evenodd is p–1 chunks where p is a prime greater than or equal to n–2. (gcd(n,m) is the greatest common divisor of n and m.) These are general formulas; they sometimes may have factors of a power of 2 which, by redefinition of a chunk, can reduce the intersection chunk count.

Another condition desirable for an efficient algorithm is that (d) valid algorithms should be easily found even for large n and m. This is a given for Reed-Solomon, and any Vandermonde-based code, and works for Evenodd—for m=2 only—because there is a general formula based on the next prime p. Wiencko codes are found by searches which become more difficult as n and m increase, if one requires small-dimension finite field expressions.

Another desirable condition, which is not easily satisfied by Reed-Solomon variants, is: (e) The number of XORs required to encode parity should not be much in excess of the theoretical minimum, which is m*(n–m–1) XORs per n–m bits of data. This minimum follows from the Singleton bound since each of the n–m data entries must appear in m parities. Wiencko codes equal or come near to this optimum in many cases, and Evenodd is close, especially for large n. But standard Reed-Solomon misses it by a large factor, due to the complexity of finite field operations, and according to [B2] the Reed-Solomon-like m=2 code even follows a higher power law. Known Wiencko codes also miss the optimum by a large factor when n and m become large.

New methods are needed for m=2 and 3 that satisfy condition (c) and (e) simultaneously for large n. New methods are especially needed for m>3, to satisfy all these requirements at once. Embodiments of the present invention provide such methods. Embodiments of the invention also teach a systematic criterion for proving correctness (and finding decoding algorithms) for values of m greater than 3. Other embodiments of the present invention teach a pipeline method to vastly improve XOR efficiency, so that large finite field size becomes an advantage.

Specific embodiments of the present invention are now described. In the following descriptions, finite fields of Characteristic 2 (bit) fields are used as an example, but the methods can be extended to other finite fields.

Encoding Algorithm, Conditions for Correct Codes and Code Examples

In the present disclosure, the meanings of various common mathematical symbols are easily understood from their context. For instance, "+" between vectors or matrices is addition over the bit field (or other fields if appropriate), while "+" in the exponents is integer addition. When special notations are used, they are expressly defined. It is assumed that one of ordinary skill in the relevant art has general knowledge of finite field theory.

A first embodiment of the present invention is a method of constructing a multiple-redundancy erasure code and a data encoding method using such a code. According to this embodiment, a code (referred to as Reed-Solomon-like code) for coding data symbols $b_0, b_1, \ldots b_{d-1}$ (where d is the data dimension) has the form $$\text{code}\left(\begin{pmatrix} b_0 \\ b_1 \\ \vdots \\ b_{d-1} \end{pmatrix}\right) = \begin{pmatrix} I \\ P \end{pmatrix} \begin{pmatrix} b_0 \\ b_1 \\ \vdots \\ b_{d-1} \end{pmatrix} \quad (2a)$$

where I is an identity matrix and P is a parity matrix, which is defined as follows:

$$P = \begin{pmatrix} 1 & \alpha^s & \alpha^{2s} & \cdots & \alpha^{(d-1)s} \\ 1 & \alpha^{s+1} & \alpha^{2(s+1)} & \cdots & \alpha^{(d-1)(s+1)} \\ \vdots & \vdots & \vdots & \vdots & \vdots \\ \vdots & \vdots & \vdots & & \vdots \\ 1 & \alpha^{s+m-1} & \alpha^{2(s+m-1)} & \cdots & \alpha^{(d-1)(s+m-1)} \end{pmatrix} \quad (3)$$

where $\alpha$ is a primitive element of a finite field FN, typically taken to be a generator of the multiplicative group. Here d is the data dimension, m is the parity (redundancy) count, s is an integer base power (the significance of which will be explained later), the step (in the second column) for the power going down is 1, and the power increases linearly from left to right in every row. The code generated by equation (2a) thus contains d+m symbols, including d data symbols and m parity symbols calculated from the parity matrix P.

Note that the formula for the parity calculation employed by the Reed-Solomon-like B-adjacent parity in [B1] and [B2], which is given by setting the parity matrix in equation (2a) above as $$P = \begin{pmatrix} 1 & 1 & 1 & \cdots & 1 \\ 1 & \alpha & \alpha^2 & \cdots & \alpha^{d-1} \end{pmatrix}, \quad (4)$$

is a special case of (3) for s=0 and m=2. (Note that the data dimension is labeled m in [B2].) It has also been suggested that the Reed-Solomon-like method for m=2 could be extended to m=3, which would be a special case of (3) for s=0, m=3. See F. J. MacWilliams and N. J. A. Sloane, "The Theory of Error-Correcting Codes," Amsterdam, The Netherlands: North-Holland, 1977, page 326, and Mario Blaum, Jim Brady, Jehoshua Bruck, Jai Menon, and Alexander Vardy: "The EVENODD Code and its Generalization: An Efficient Scheme for Tolerating Multiple Disk Failures in RAID Architectures", Chapter 14, "High Performance Mass Storage and Parallel {I/O}: Technologies and Applications", Hai Jin and Toni Cortes and Rajkumar Buyya, editors, IEEE Computer Society Press and Wiley, 2001.

In embodiments of the present invention, the finite field FN is of dimension N over the bit field. Each symbol $b_i$ is N-bit and is mapped onto the field FN by a mapping. The field FN is generated as an algebra over the bit field by the primitive element $\alpha$ satisfying an irreducible polynomial equation $$p(\alpha)=0$$

where $$p(x)=x^N+c_{N-1}x^{N-1}+\ldots+c_1x+1 \quad (5)$$

where the c's are 0 or 1, addition is over the bit field (that is, it is bitwise XOR), and multiplication is in the field FN. This can be expressed by expressing $\alpha$ as an N×N matrix over the bit field:

$$\alpha = \begin{pmatrix} 0 & 1 & 0 & \cdots & 0 \\ 0 & 0 & 1 & \cdots & 0 \\ \vdots & \vdots & \vdots & \vdots & \vdots \\ 0 & 0 & 0 & \cdots & 1 \\ 1 & c_1 & c_2 & \cdots & c_{N-1} \end{pmatrix} \quad (6)$$

Then, as is known from algebra and finite field theory, an isomorphic image of the entire field FN is spanned by powers of this matrix, which may be thought of as operating on the right of row vectors of coefficients of powers of $\alpha$, with the leftmost entry in the vector being the constant coefficient. In preferred embodiments, N is a power of 2, so as to satisfy condition (c) above.

Now define $$\alpha_k = \alpha^{s+k} \quad (7)$$

The k-th parity symbol calculated from the parity matrix (3) is (counting k from 0)

$$q_k = \sum_{i=0}^{d-1} b_i \alpha_k^i \quad (8)$$

This expression can be efficiently evaluated using Horner's method, which in field notation gives:

$$q_k = b_0 + \alpha_k(b_1 + \alpha_k(b_2 + \ldots \alpha_k(b_{d-1})\ldots)) \quad (8a)$$

Horner's method may be implemented by a Horner's accumulator described later, with one species of accumulator for the matrix expression of each $\alpha_k$. As will be seen, a Horner's method accumulator achieves XOR-efficient evaluation of polynomials with variable vector coefficients and constant sparse square matrix abscissa.

The parity matrix P set forth in equation (3) will give a correct Reed-Solomon-like code if all square submatrices of P are nonsingular (referred to here as the "strong invertibility condition"). As used in the instant disclosure, a submatrix is a matrix consisting of the intersection of a number of rows and a number of columns of the original matrix. This strong invertibility condition is not always satisfied. Methods for finding efficient and correct Reed-Solomon-like code for redundancy m greater than 2 will now be described.

First of all, assume $\alpha$ is nonzero and hence invertible. It follows that any value of s in the parity matrix (3) is equivalent from the point of view of correctness, since changing s amounts to multiplying each column by a non-zero constant, which does not affect matrix invertibility. The analysis to follow, therefore, will treat the case s=0 and the powers therefore run from 0 to m−1, as in a standard Vandermonde type matrix. Each row of P will be labeled by its index k counting from 0, which is therefore also its row power. The strong invertibility condition is reduced to: For every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix} \quad (9)$$

is nonzero in the field FN (i.e. the matrix is nonsingular).

Based on the strong invertibility condition, the conditions for giving correct Reed-Solomon-like codes for m up to 5 will be enumerated. Based on these descriptions, those skilled in the art will understand how to extend this method for m greater than 5.

m=1 always works (i.e. gives a correct code), and is known as RAID4. m=2, as mentioned above, works if $\alpha$ is nonzero and all the powers of $\alpha$ in the second row are different. This is equivalent to the requirement that the order of $\alpha$ in the multiplicative group of FN be greater than or equal to d. By choosing $\alpha$ to be a primitive element that is a generator of the multiplicative group, this is equivalent to the requirement $$d < 2^N \quad (10)$$

For N=8, the requirement is d<256. The above code finding methods for m=1 and m=2 are known in the art.

In what follows, a square submatrix of P is defined to be of form "i>j>..." if its rows are subsets of rows i, j, .... Thus the number of rows is equal to the count of entries in the form expression. The term "Vandermonde" is used to mean "Vandermonde with differing columns", and therefore Vandermonde will imply invertible. Multiplying each column of a matrix by a nonzero scalar will be referred to as "column scaling", and multiplying each row of a matrix by a nonzero scalar will be referred to as "row scaling". If the matrix is square, neither row scaling nor column scaling affects its invertibility. Both "+" and "−" are used to mean characteristic 2 addition (bitwise XORing). The notation M followed by numbers indicates the rows are raised to those powers times i for the first column, j for the second column, k for the third column (if any), etc. The notation L followed by numbers indicates the rows are raised to those powers multiplied by 0 for the first column, i times the second, etc.

For the m=3 case, again, $\alpha$ is assumed to be nonzero of order greater than or equal to d. Then all square submatrices of size 1 work because they are nonzero scalars. All square submatrices of size 3 work because they are form "0>1>2>" which is Vandermonde. Of square submatrices of size 2, "0>1>" works because it is Vandermonde, and "1>2>" works because it is produced by multiplying each column of a Vandermonde matrix by a nonzero scalar.

A matrix of form "0>2>" has the general form $$M02 = \begin{pmatrix} 1 & 1 \\ \alpha^{2i} & \alpha^{2j} \end{pmatrix} \quad (11)$$

where $0 \leq i < j < d$. Its determinant is $$|M02| = \alpha^{2j} - \alpha^{2i} = (\alpha^j - \alpha^i)^2 = |M01|^2 \quad (12)$$

where the last equality holds because the field is of characteristic 2. Therefore, under the order assumption, |M02| is always nonzero. The case m=3 thus works for the same $\alpha$ and maximum d as the corresponding case m=2, with no further conditions required, as long as the field is of characteristic 2. Some examples of codes for m=3 are given in Table 1 below.

For the case m=4, under the same assumptions as imposed on m=2 and m=3, square submatrices of size 1 are invertible because they are nonzero, and square submatrices of size 4 are invertible because they are Vandermonde. The forms for size 2 are "0>1>", "1>2>", "2>3>" (all Vandermonde or column scaled Vandermonde), "0>2>", "1>3>" (all invertible by the argument of (12) or column scaled from such a matrix), and "0>3>". The general form for the last case is $$M03 = \begin{pmatrix} 1 & 1 \\ \alpha^{3i} & \alpha^{3j} \end{pmatrix} \quad (13)$$

where $0 \leq i < j < d$. Its determinant is $$|M03| = \alpha^{3j} - \alpha^{3i} = (\alpha^{2i} + \alpha^{i+j} + \alpha^{2j})|M01| \quad (14)$$

which is nonzero if and only if 3(j−i) is not a multiple of the order of $\alpha$. This will always be satisfied if $$d \leq \operatorname{order}(\alpha)/\gcd(\operatorname{order}(\alpha),3) \quad (\text{IVa})$$

To continue the m=4 case, the forms for size 3 are "0>1>2", "1>2>3>" (all Vandermonde or column scaled Vandermonde), "0>1>3" and "0>2>3>". The general form for "0>1>3>" is, for $0 \leq i < j < k < d$:

$$M013 = \begin{pmatrix} 1 & 1 & 1 \\ \alpha^i & \alpha^j & \alpha^k \\ \alpha^{3i} & \alpha^{3j} & \alpha^{3k} \end{pmatrix} \quad (15)$$

Row scaling implies that invertibility of (15) is equivalent to invertibility of the specialization where the left power is 0: for $0<i<j<d$, $$L013 = \begin{pmatrix} 1 & 1 & 1 \\ 1 & \alpha^i & \alpha^j \\ 1 & \alpha^{3i} & \alpha^{3j} \end{pmatrix} \quad (16)$$

A similar general form for "0>2>3>" can be reduced to (16) by reversing the order of rows, reversing the order of columns, column scaling, and row scaling.

By analogy, the "0>1>2>" Vandermonde specialization may be defined as $$L012 = \begin{pmatrix} 1 & 1 & 1 \\ 1 & \alpha^i & \alpha^j \\ 1 & \alpha^{2i} & \alpha^{2j} \end{pmatrix} \quad (17)$$

then direct evaluation of the determinant shows that $$|L013|=(1+\alpha^i+\alpha^j)|L012| \quad (18)$$

and so M013 is invertible if and only if (characteristic 2)

$$\alpha^i+\alpha^j \ne 1 \text{ for all } i \text{ and } j \text{ such that } 0<i<j<d \quad \text{(IVb)}$$

For any d and nonzero α such that the conditions (IVa) and (IVb) hold, the m=4 version of (3) is a correct Reed-Solomon-like code. Some examples of correct codes for m=4 are given in Table 1 below.

For the case m=5, all the conditions required for m=4 must hold for the same α and the same d, since the set of square submatrices of the version of P for m=4 is a subset of the set of square submatrices of the version of P for m=5. In fact it equals the set of square submatrices that do not have 4> in their form. As before, size 1 and size maximum (5) hold because of nonzero entries and Vandermonde respectively. Size 2 has the following forms including 4>: "0>4>", "1>4>", "2>4>", and "3>4>". Of these, the last three are column scalings of "0>3>", "1>3>", and "2>3>", which are already known to work by the conditions for m=4. That leaves "0>4>", which is proved Vandermonde by the same argument as "0>2>" was in (11) and (12), since this is a field of characteristic 2.

$$|M04|=\alpha^{4j}-\alpha^{4i}=|M01|^4=|M02|^2 \quad (12b)$$

Size 3 has the following forms including 4>: "0>1>4>", "0>2>4>", "0>3>4>", "1>2>4>", "1>3>4>", "2>3×4>". Of these, the last three are column scalings of "0>1>3>", "0>2>3>", and "1>2>3>" respectively, and thus known to work by the conditions for m=4. "0>2>4>" is Vandermonde, since its columns are squared from the columns of "0>1>2>" and, since this is a field of characteristic 2, are thus unequal if the latter are. "0>3>4>" is equivalent to "0>1>4>" by the technique used on "0>2>3>" above. This leaves (after reduction as from (15) to (16))

$$L014 = \begin{pmatrix} 1 & 1 & 1 \\ 1 & \alpha^i & \alpha^j \\ 1 & \alpha^{4i} & \alpha^{4j} \end{pmatrix} \quad (19)$$

then direct evaluation of the determinant shows that $$|L014|=(1+\alpha^i+\alpha^j+\alpha^{2i}+\alpha^{i+j}+\alpha^{2j})|L012| \quad (20)$$

which is nonzero if and only if (characteristic 2)

$$\alpha^i+\alpha^j+\alpha^{2i}+\alpha^{i+j}+\alpha^{2j} \ne 1 \text{ for all } i \text{ and } j \text{ such that}$$
$$0<i<j<d \quad \text{(Va)}$$

Size 4 has the following forms including 4>: "0>1>2>4>", "0>1>3>4>", "0>2>3>4>", and "1>2>3>4>". Of these, "1>2>3>4>" is column shifted from "0>1>2>3>" and so valid, and "0>2>3>4>" is equivalent to "0>1>2>4>" by an argument analogous to that used for "0>2>3>". Direct evaluation, using notation analogous to the above (with 4×4 matrices for $0<i<j<k<d$) gives for "0>1>2>4>"

$$|L0124|=(1+\alpha^i+\alpha^j+\alpha^k)|L0123| \quad (21)$$

leading to the requirement $$\alpha^i+\alpha^j+\alpha^k \ne 1 \text{ for all } i, j, k \text{ such that } 0<i<j<k<d \quad \text{(Vb)}$$

And, for "0>1>3>4>" it gives $$|L0134|=(\alpha^i+\alpha^j+\alpha^k+\alpha^{i+j}+\alpha^{i+k}+\alpha^{j+k})|L0123| \quad (22)$$

which is nonzero if and only if $$\alpha^i+\alpha^j+\alpha^k+\alpha^{i+j}+\alpha^{i+k}+\alpha^{j+k} \ne 0 \text{ for all } i, j, k \text{ such that}$$
$$0<i<j<k<d \quad \text{(Vc)}$$

For any d and nonzero α such that the conditions (IVa), (IVb), (Va), (Vb), and (Vc) hold, the m=5 version of (3) is a correct Reed-Solomon-like code. Some examples of correct codes for m=5 are given in Table 1 below.

Based on the above descriptions, those skilled in the art can extend this technique to any m>5, and also to any field, since equations relating any form determinant to the corresponding Vandermonde determinant can be derived using symmetric polynomial theory.

Finding irreducible polynomials and primitive elements for any N is a well-known exercise in field theory. The number of irreducible polynomials of degree N over the bit field is approximately $$2^N/N$$

(the exact formula involves Moebius functions) and so increases rapidly with N. Since for any fixed value of d and m, the set of conditions of the kind of IVa, IVb required to prove (3) works comprise a fixed, finite set of polynomials required to be simultaneously nonzero, they can have only a limited number of points of failure. Thus, for N big enough, a value of a is guaranteed to exist for which (3) satisfies the strong invertibility condition for this m and d.

The value of N required to guarantee this by the analysis is high, especially if one requires the polynomials to be sparse. Therefore a search among sparse irreducible polynomials is desirable, testing all the conditions for various m to find valid d. This is a modest exercise in computer programming, which tends to uphold the far more optimistic view that the condition failure locations (roots) behave as if random. Some specific results are given below. The polynomials in this table are expressed as a string of their coefficients in the form $1C_1C_2 \ldots C_{N-1}1$ (see equation (5)). (Taking the coefficients in the opposite order is equally valid in every case, since it provides the minimal polynomial for $\alpha^{-1}$.) The "XOR excess" column will be described later.

TABLE 1

| N | m | d maximum | XOR excess | Polynomial |
|---|---|---|---|---|
| 8 | 3 | 255 | 6/24 = 25% | 101110001 |
| 16 | 3 | >255 | 6/48 = 13% | 10010001001000001 |
| 32 | 3 | >255 | 6/96 = 7% | # |
| 8 | 4 | 33 | 11/32 = 35% | 110100011 |
| 16 | 4 | >255 | 12/64 = 19% | 10010001001000001 |
| 32 | 4 | >255 | 11/128 = 9% | # |
| 8 | 5 | 13 | 16/40 = 40% | 110110001 |
| 16 | 5 | 102 | 18/80 = 23% | 10010001001000001 |
| 16 | 5 | 120 | 30/80 = 37% | 10010001101000101 |
| 32 | 5 | >255 | 16/160 = 10% | # |
| 32 | 5 | >255 | 18/160 = 11% | ## |

\# 100000000000000000011100000000001
\#\# 100000000000000010000001000000101

All but one of the polynomial examples given in Table 1 have only three non-zero coefficients in addition to $C_N$ and $C_0$. In other words, they satisfy an irreducible polynomial equation $$\alpha^N + \alpha^h + \alpha^g + \alpha^f + 1 = 0$$

where f, g and h are integers satisfying $0 < f < g < h < N$.

To summarize, embodiments of the present invention include the technique of using the conditions IVa, IVb, Va, Vb, and Vc and the technique for deriving further similar conditions and using them, for proving the strong invertibility condition is satisfied and thus equation (3) is a valid Reed-Solomon-like parity encoding matrix.

Figure 5:
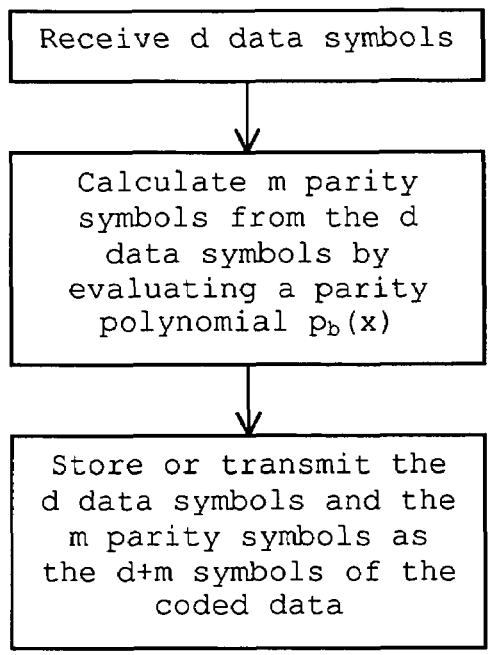
FIG. 5 is a flow chart illustrating an encoding method according to an embodiment of the present invention.
Figure 8A:
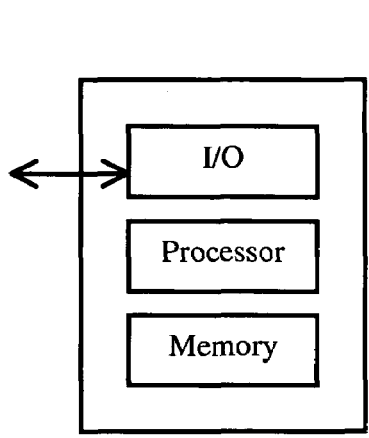
FIG. 8(a) illustrates a computer system in which the encoding and decoding methods according to embodiments of the present invention may be implemented.
Figure 8B:
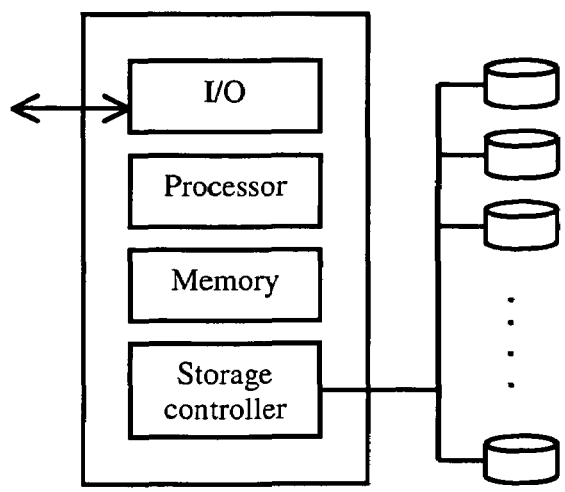
FIG. 8(b) illustrates a data storage system in which the encoding and decoding methods according to embodiments of the present invention may be implemented.

The flow chart in FIG. 5 illustrates the general steps of an encoding method that has been described in detail above. Exemplary systems in which such a method may be implemented are schematically illustrated in FIGS. 8(a) and 8(b) where FIG. 8(a) illustrates a computer system and FIG. 8(b) illustrates a data storage system. The encoding algorithm is carried out by the processor.

XOR Efficiency and Horner's Method Accumulator

Another embodiment of the present invention is the application of the Horner's method for computing polynomials involved in Reed-Solomon-like algorithms. As pointed out earlier, the k-th parity symbol calculation using the parity matrix P $$q_k = \sum_{i=0}^{d-1} b_i \alpha_k^i \quad (8)$$

where $$\alpha_k = \alpha^{s+k}, \quad (7)$$

can be efficiently evaluated using Horner's method with one species of accumulator for the matrix expression of each $\alpha_k$:

$$q_k = b_0 + \alpha_k(b_1 + \alpha_k(b_2 + \ldots \alpha_k(b_{d-1}) \ldots )) \quad (8a)$$

using field notation. For $\alpha_k = 1$, the accumulator would be a trivial accumulator.

Each step in the Horner method requires $N + M_k$ XORs, where $M_k$ is the number of XORs required for a multiply by $\alpha_k$ matrix, and there are d−1 identical steps. The matrix $\alpha$ is sparse, and irreducible polynomial p can be chosen so that it is also sparse: for N=8, 16, and 32 there are desirable values of p in which only three of the coefficients $c_i$ are nonzero for $0 < i < N$ (see Table 1 above for examples). In such a case, the matrix $\alpha$ has only N+3 nonzero entries.

Let us use as an example the following primitive element $\alpha$ (N=8):

$$A = \begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 1 & 1 & 1 & 0 & 0 & 0 \end{pmatrix} \quad (23)$$

Multiplying an 8-bit vector by $\alpha = A$ requires three XORs. With k=1 and s=0, the Horner requirement in XOR count is $$\text{XOR count} = (8+3)(d-1) = 11(d-1) \quad (24)$$

This is more efficient than the approach described in [B2]. There, the general formula for the equation (2a)-style parity calculation is, in respect of (2a), given by setting P as in equation (4). [B2] describes calculating the parity $$q = \sum_{i=0}^{d-1} b_i \alpha^i$$

by explicitly performing each multiplication (whereas [B1] describes pre-calculating the coefficients). For $\alpha = A$ as set forth above (see [B2] Equation (14)), explicitly performing each multiplication yields the total XOR count given by [B2] (page 251, left column):

$$\text{XOR count} = 8(d-1) + \sum_{i=0}^{d-1} (3i) = \frac{3d^2 + 13d - 16}{2} \quad (25)$$

Though the coefficient is small, the square term has discouraging results as d becomes very large. The XOR count using the Horner's method according to embodiments of the present invention is never worse than the quadratic value given in [B2], and rapidly becomes much better:

TABLE 2A

| d | 1 | 2 | 3 | 4 | 10 | 20 |
|---|---|---|---|---|---|---|
| Optimal | 0 | 8 | 16 | 24 | 72 | 152 |
| Horner(24) | 0 | 11 | 22 | 33 | 99 | 209 |
| [B2] (25) | 0 | 11 | 25 | 42 | 207 | 722 |

XOR count for second parity, example in [B2]

The first parity, in this case, is s=0, k=0, and the multiplication is skipped. Adding these XORs one gets:

TABLE 2B

| d | 1 | 2 | 3 | 4 | 10 | 20 |
|---|---|---|---|---|----|----|
| Optimal | 0 | 16 | 32 | 48 | 144 | 304 |
| Horner(24) | 0 | 19 | 38 | 57 | 171 | 361 |
| [B2] (25) | 0 | 19 | 41 | 66 | 359 | 894 |

XOR count for complete parity, example in [B2]

Notice that the ratio between Horner and optimal remains constant, that is, in this (m=2) case $(M_1+2N)/(2N)$ assuming $M_0=0$. (Here $M_k$ is the numbers of XORs required for multiplication by the matrix version of $\alpha_k=\alpha^{s+k}$.) This gives 19/16 in this case. The ratio of excess XORs to the optimal is $M_1/(2N)$, which gives 3/16 or 19% in this case.

In Table 1 set forth earlier, the column labeled "XOR excess" summarizes the ratio of excess XORs for the code examples given therein (using the balanced strategy of setting the base power s, see below). It can be seen that the percent of XOR excess actually decreases as N increases. Because of the Horner accumulator, a large finite field can be used with little code size burden. This is an advantage of embodiments of the present invention not achieved by other Reed-Solomon-related methods. It makes the techniques described here highly desirable for encoding very large arrays, like d=255, m=5.

In the parity matrix expression (3), the integer s can be set freely. This may be used to change the powers of α to further reduce the XOR count of the parity calculation. The typical best value for s is $-[(m-1)/2]$ where [x] is the greatest integer less than or equal to x (i.e., $s=-(m-1)/2$ for odd m and $s=-(m-2)/2$ for even m). To illustrate this, consider the square of the matrix A given in equation (23):

$$A^2 = \begin{pmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 1 & 1 & 1 & 0 & 0 & 0 \\ 0 & 1 & 0 & 1 & 1 & 1 & 0 & 0 \end{pmatrix} \quad (26)$$

Using a temporarily stored XOR of the rightmost two bits in the row vector being multiplied on the right by this matrix, one can reduce the number of XORs for a multiply to 5, but that is still greater than the 3 required for a multiply by A. Now, contrast the inverse of the matrix A:

$$A^{-1} = \begin{pmatrix} 0 & 1 & 1 & 1 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix} \quad (27)$$

Multiplication by this matrix, like multiplication by A, requires only three XORs.

Thus, the m=3 algorithm based on α=A is improved in efficiency by using s=−1 as opposed to s=0. Using the same consideration as in the discussion of Tables 2A and 2B above, one finds that for s=0 the ratio of excess XORs to the optimal is (0+3+5)/(8+8+8)=8/24=33%, while for s=−1 this ratio is (3+0+3)/(8+8+8)=6/24=25%. The optimal approach for sparse polynomials is to balance the powers, which is done by setting $s=-[(m-1)/2]$, as mentioned above.

To further increase the efficiency of the algorithm, consideration may also be given when choosing the primitive element α for a code. For example, if higher powers are required, as for m>3, it is desirable to keep the nonzero coefficients in α as far as possible from the ends; i.e. take care that $c_1, c_2, \ldots$ are zero and $c_{N-1}, c_{N-2}, \ldots$ are zero insofar as possible. If minimum XOR count is desired, for a specific degree of sparseness, then having all the nonzero coefficients together (as in A in equation (23)) is desirable for higher powers. If XORs can be done in parallel within a Horner step, then optimization is accomplished by separating the nonzero coefficients from one another. That results in at most two 1s in a column even for higher powers, meaning all XORs can be done in parallel. This is not practical for N=8, but works well for bigger N. Examples will be further discussed later in connection with the Horner accumulator. In the examples given in Table 1, the 32nd degree polynomial #100000000000000000011100000000001 is optimized for serial XORs. The 32nd degree polynomial ##100000000000000001000000100000101 satisfies the parallel optimization condition for powers between −2 and +2.

Another embodiment of the present invention is a Horner's method accumulator apparatus and method developed for XOR-efficient evaluation of polynomials with variable vector coefficients and constant sparse square matrix abscissa, such as equation (8) above. This accumulator is easily used for very large dimensions, allowing, in particular, for low gate count and low XOR count operations on large finite fields such as 16 and 32 bit fields. It is particularly suitable for application to parity and syndrome generation for the Reed-Solomon-like multiple redundancy RAID algorithms described earlier. The Horner's accumulator operation on very large fields thus permits encoding algorithms with XOR count efficiency better than that offered by known methods based on finite fields limited in practice to 8 bits.

In what follows, the Horner's accumulator is described as applying to a rectangular chunk (or block) of data of N by K bits, where N is the dimension of a finite field over the bit field {0,1} (i.e. the bit vector dimension) and K is a count of bit vectors. The implementation is identical for each bit vector, indexed by a depth-wise coordinate j ranging from 0 to K−1. For a fixed N×N bit matrix A, expressed as a fixed sequence of bit shifts and XORs, the same A for each incrementally accumulating vector variable $acc_j$ and input side vector $b_j$ (both N-wide row vectors), the accumulator's operation may be expressed as $$acc_j=(acc_j*A)+b_j$$

An example of an accumulator is shown in FIG. 1 for a specific A which applies to an 8-bit vector. FIG. 1 (as well as each of FIGS. 2 to 4) shows a slice for a single value of j, if the operations are interpreted single bit, or the entire accumulator block, if K identical operations are piled perpendicularly to the plane of the paper. For clarity, the descriptions below are given for a single j. In each of these figures, time and causality move left to right. The same or similar components in FIGS. 1–4 are given the same or similar reference symbols.

FIG. 1 shows an accumulator for the A defined in equation (23) above, or expressed as the 8-th degree primitive polynomial 101110001 (constant term to left). The accumulator has an accumulator input 11 (trunk input), a side input 12, and an accumulator output 13 (trunk output), where A (a) is the lowest and H (h) the highest order bit. The bits may be indexed by a width-wise coordinate i. Splitters 14 allow some inputs to drive more than one output. Each of XOR combiners 15 and 17 combines two inputs to generate one output bit. A shift 16 is interposed before combiner 17 (the side combiner), and shifts each bit except H to the next higher bit position, while H is shifted to A.

A latching mechanism (not shown in the drawing) ensures that each bit of the trunk input 11 and side input 12 is stable in time to drive all dependent bits of the output 13. This allows for many kinds of sequencing and tradeoffs between time and area, including parallel, pipelined or serial operations using standard, wide-XOR, or specialized hardware.

Figure 2:
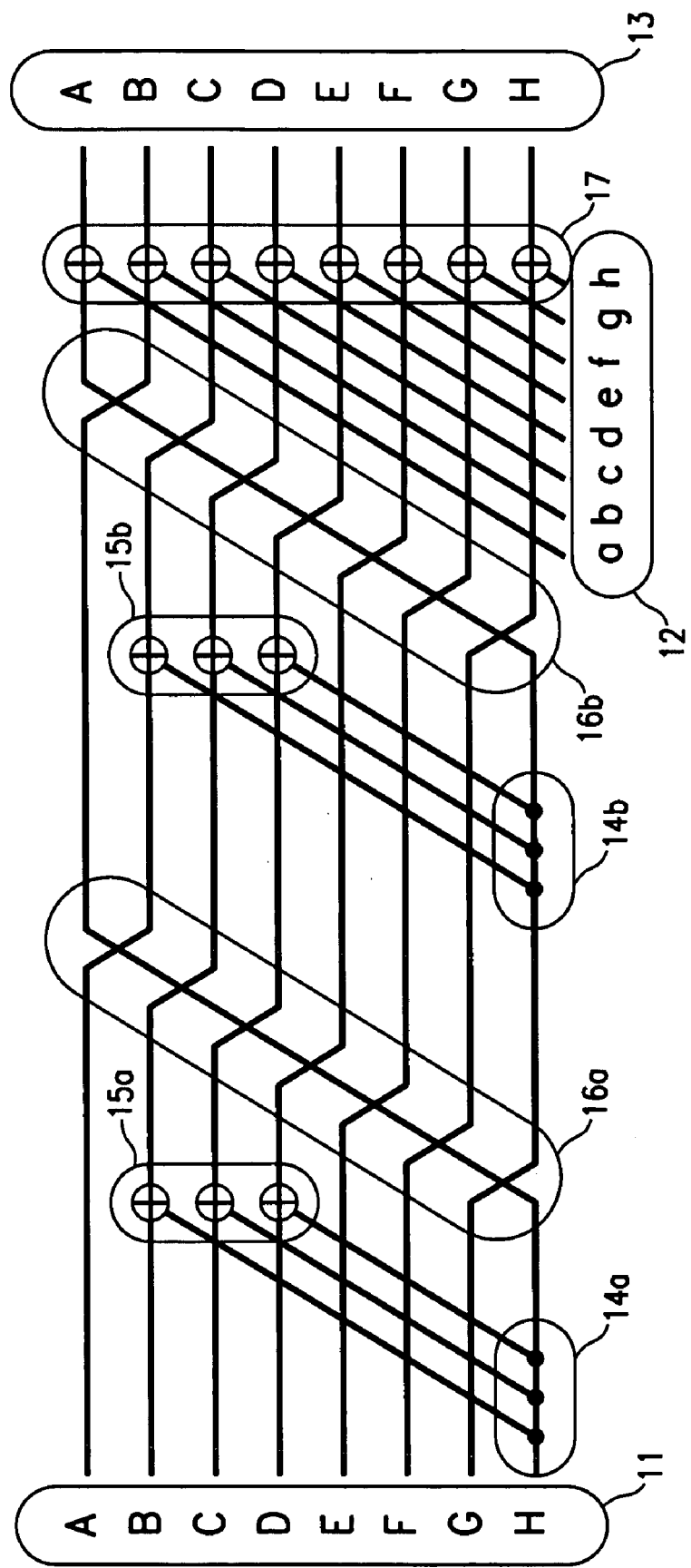

FIG. 2 shows an accumulator for the matrix $A^2$ (see equation (26)), acting upon accumulator input 11 and side input 12 to give accumulator output 13. First splitters 14a, first combiners 15a and first shift 16a are identical to splitters 14, combiners 15 and shift 16 in FIG. 1, respectively. Second splitters 14b, second combiners 15b and second shift 16b are also structurally identical to splitters 14, combiners 15 and shift 16, respectively, but operating on bits that have been operated on by the first splitters 14a, first combiners 15a and first shift 16a, creating a net effect of a repeated application of the matrix A. Side combiner 17 has the same effect as side combiner 17 in FIG. 1.

Figure 3:
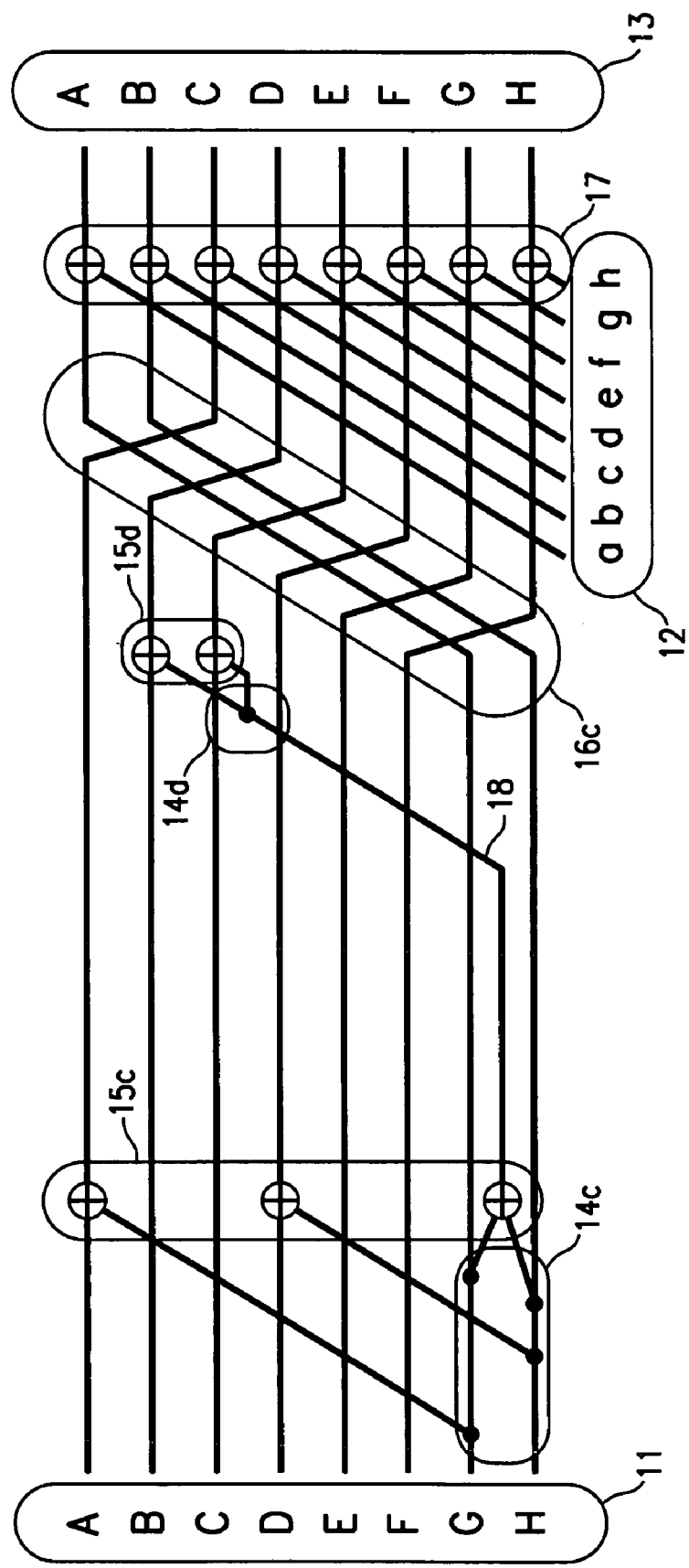

FIG. 3 shows an accumulator equivalent to that of FIG. 2, but with a reduced total number of combiners, at the cost of a ninth temporary storage bit 18. Splitters 14c and combiners 15c create nine storage bits, splitter 14d and combiners 15d reduce these to eight again. Unlike the shifts 16 in FIG. 1 and 16a, 16b in FIG. 2, Shift 16c in FIG. 3 shifts each of bits A to F by two bits, and shifts bits G and H to A and B, respectively. The eight bits after shift 16c are equivalent to the eight bits in FIG. 2 after shift 16b. Then the side combiners 17 have the same effect as the side combiners 17 in FIG. 2, producing an identical result as FIG. 2.

Figure 4:
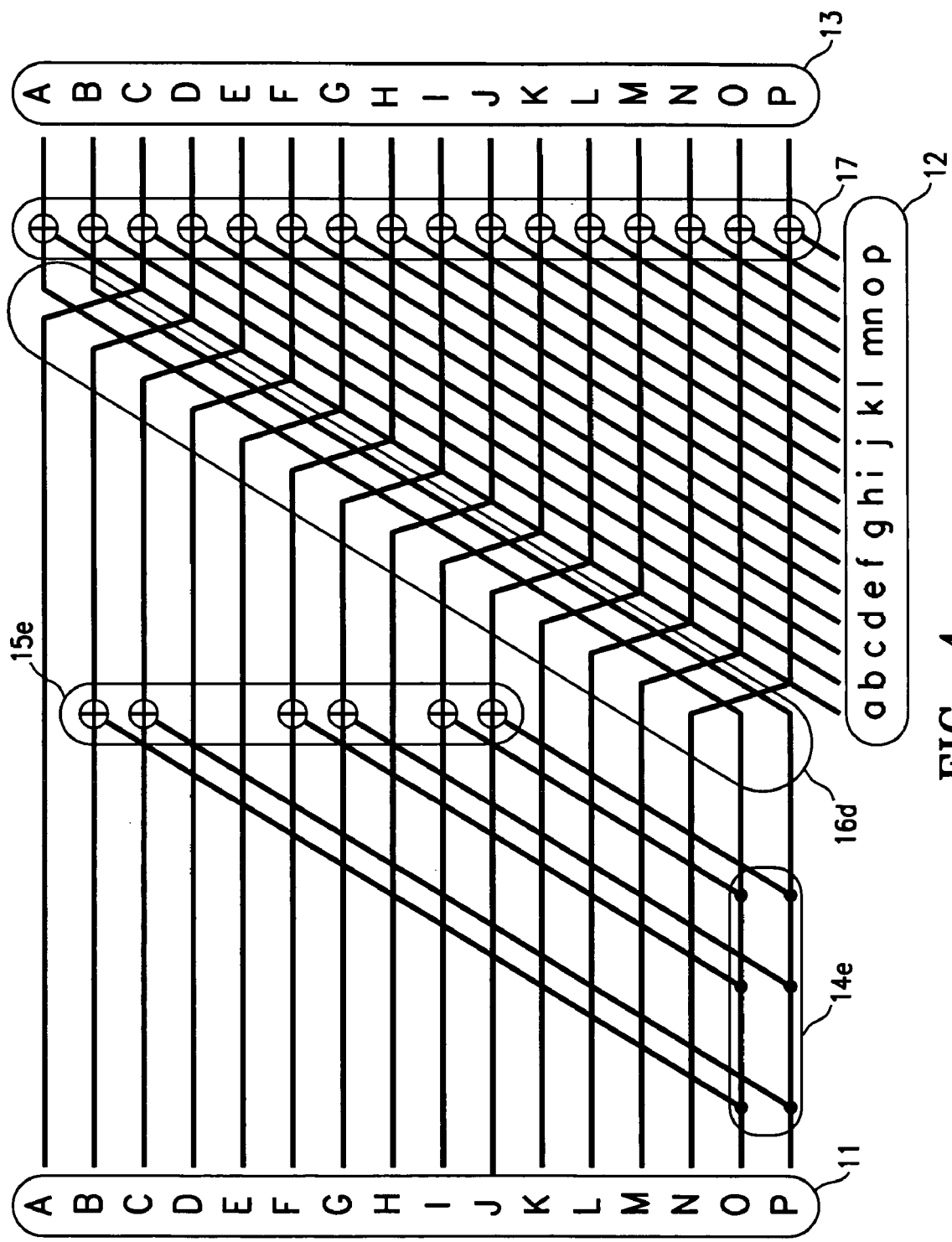

FIG. 4 shows an accumulator for a matrix $B^2$, where B is defined from the 16th degree polynomial 10010001001000001 in the same way the matrix A was defined from the polynomial 101110001. Because of the character of the matrix B, it is possible to postpone the two-bit shift 16d till after splitters 14e and combiners 15e in such a way that all combines 15e can be performed in one step in the pipeline. This plus side combiners 17 finishes the accumulate in two pipeline steps, even though B is squared, in contrast to the three pipeline steps required for $A^2$ in either FIG. 2 or FIG. 3.

In each of FIGS. 1–4, the collection of splits 14, XOR combiners 15 and shifts 16 located before the side combiner 17 can be considered to form a mapping pattern (logic) that maps the accumulator input 11 to a pattern-mapped vector which is subsequently combined with the side input 12.

The accumulators described above are merely examples, and Horner's accumulators for other primitive elements (such as those shown in Table 1) as well as other positive and negative powers of the primitive elements can be similarly constructed.

The Horner's accumulator described above may be implemented either in hardware or in software. In a hardware implementation, the splitters and shifts may be implemented by conductors and do not require a separate pipeline step.

Although the descriptions above deal with single bit operations, large efficiencies can be gained by doing bulk operations for j ranging over K values for a large K. This bulk effect can be achieved, for example, with multiple hardware copies of an accumulator fitting the design described, or with one or more accumulators each operating a wide-XOR engine at every XOR combine point, or with software using wide efficient XOR commands at every XOR combine point, or with combinations of the above. Such replication is aided, for a given gate count, by the fixed nature of the matrix multiplication pattern for each constant matrix.

To compute the polynomial q discussed earlier, $$q = \sum_{i=0}^{d-1} b_i a^i$$

a full block output q is generated from d input blocks $b_i$ by the following pipeline of d−1 accumulator steps (here for clarity j is omitted, though the preferred embodiment of the invention uses j ranging over large K):

$$acc = (b_{d-1} * A) + b_{d-2}$$
$$acc = (acc * A) + b_{d-3}$$
$$\vdots$$
$$acc = (acc * A) + b_1$$
$$q = (acc * A) + b_0$$

All d−1 steps involve an add and a multiplication by the same matrix A. For example, if the value of A is hardcoded with shifts and XORs, a single accumulator circuit can perform all the multiply accumulates for the calculation of q from the b's. This provides high efficiencies in hardware implementations. Alternatively, identical copies of the accumulator circuit may be used sequentially such that the trunk output of one accumulator is fed to the trunk input of the next accumulator. This also requires different data blocks $b_i$ to be fed into different copies of the accumulator. Alternatively, the above two approaches may be combined; for example, multiple copies of the accumulator circuit are connected sequentially and the trunk output of the last accumulator is coupled to the trunk input of the first accumulator, or the operation is iterated on one accumulator and then its output coupled to the input of another accumulator.

The Horner accumulator described above allows efficient processing of large sized data blocks, such as N*K>32. This provides an advantage over other methods of implementing parity and syndrome calculations which tend to be limited to the 32-bit size of the processors used. Thus, the Horner accumulator improves the efficiency even in the redundancy m=2 (RAID6) or m=3 case, since known methods have practically been limited to the N=8 field. In addition, known methods for parity and syndrome calculation are practically limited by word-wide multipliers, handling for example four 8-bit field elements at a time for a 32-bit word, while the Horner accumulator described here can use wide XOR techniques to transcend word limit even for N>8.

Efficient Decoding Methods

In a RAID system encoded with the encoding algorithm described above, when up to m data and/or parity blocks are lost, the lost data and/or parity can be reconstructed by a decoding algorithm to solve the erasure patterns. Decoding involves calculating the syndromes corresponding to missing data disks and valid parity disks, and applying an inverse of a square submatrix of the encoding matrix to the syndromes. The syndromes may be efficiently calculated by the Horner's methods described earlier. As the count of data erasures k increases, the relative cost of multiplying k syndromes by the inverse of a k by k matrix whose entries are finite field elements may come to dominate decoding costs, especially for smaller d.

Embodiments of the present invention include methods for efficient decoding of the Reed-Solomon-like codes. Two methods are described: One uses a tower coordinate technique to efficiently carry out finite field element calculations for large N; the other uses a stored one-dimensional table of powers of $\alpha$ and Schur expressions to efficiently calculate the inverse of the square submatrices of the encoding matrix.

An efficient method for calculating finite field element products and inverses is described first. A code based on 32-bit finite field is used as an example in efficiency calculations, but it will be apparent to those skilled in the art that a similar analysis can be carried out for any bit field of dimension a power of 2, such as 16, 64, etc. A finite field technique has been known for extending each finite field of dimension a power of 2 to the finite field of dimension the next power of 2, and using this tower of extensions to permit finite field addition by bitwise XORing, and finite field multiplication and inversion in the bigger field through combinations of similar operations in the smaller field. A description of this method in the context of efficient software operations can be found in Aoki and Ohta: "Fast Arithmetic Operations over F2n for Software Implementation", hereinafter [AO], found in SAC'97 "Presented Papers", at www.scs.carleton.ca/~sac97/program/FinalPapers/paper24.ps. Different from the techniques described in [AO] reference, however, the present embodiment treats constant multiply by certain constants specified herein as a separate category of operation than multiply. This provides further efficiencies not achieved by the [AO] method.

According to the tower coordinate extension technique, if a bit vector of the smaller field FS is called a "short", then a bit vector of the larger field FL, called a "long", is built of two "shorts", one high order and one low, with the usual little-endian 0-based numbering. A fixed element g of FS can be found such that the equation $$X^2 + X + g = 0 \tag{28}$$

does not have a solution in FS. The extension technique expresses any element of FL as yx (y to the left of x, or y the high order "short" and x the low order "short") where A in FL is selected to satisfy (28), i.e., $$A^2 + A + g = 0 \tag{29}$$

and $$yx = (y*A) + x \tag{30}$$

It follows that if vu is similarly (v*A)+u, then addition works trivially by bitwise XOR in FL if it worked by bitwise XOR in FS, and by (29) one gets $$yx*vu = ((y*v) + (y*u) + (x*v))*A + ((x*u) + (y*v*g)) \tag{31}$$

This can be programmed as $$q = (y+x)*(v+u)$$

$$r = x*u;$$

$$s = r + (y*(v*g));$$

$$t = q + r;$$

and then yx*vu=ts. Thus, three multiplies, one constant-multiply (by g), and four XORs in FS give one multiply in FL.

Similarly, note that if v=y and u=x+y in the above calculation, then t comes out 0, and s (which is in FS) is nonzero unless both x and y are 0. Thus, for nonzero yx, one can get ts equal the inverse of yx by the program $$q = y*((y*g)+x) + \text{square}(x);$$

$$r = \text{inverse}(q);$$

$$s = r*(x+y)$$

$$t = r*y$$

So, an inversion in FL requires one inversion, three multiplies, one squaring, one constant-multiply, and three XORs in FS.

Similar considerations show that one squaring in FL requires two squarings, one constant multiply, and one XOR in FS; and one XOR in FL requires two XORs in FS. Note that both squaring and constant multiply are given special categories because they can be tabulated for a bigger field (i.e. 16 bit) than multiply (which can be tabulated only for an 8-bit field, unless one has 8GB of table memory available).

Finally, as noted in [AO], A*g in FL serves the same purpose as g in FS, since $X^2+X+A*g=0$ has no solution in FL under the assumptions on g and A; so the special constant multiply in FL is yx*g0=(y*A+x)*(g*A)=t*A+s where t=(y+x)*g and s=y*g*g. Therefore, a constant-multiply in FL requires three constant-multiplies and one XOR in FS.

The matrix for doubling the field bit count is:

$$\begin{pmatrix} ninvS \\ nmulS \\ nsquS \\ ncmuS \\ nxorS \end{pmatrix} = \begin{pmatrix} 10000 \\ 33000 \\ 10200 \\ 11130 \\ 34112 \end{pmatrix} \begin{pmatrix} ninvL \\ nmulL \\ nsquL \\ ncmuL \\ nxorL \end{pmatrix} \tag{32}$$

where ninvS and ninvL are the number of inversions in FS and FL, respectively; nmulS and nmulL are the number of multiplies in FS and FL, respectively; nsquS and nsqulL are the number of squarings in FS and FL, respectively; ncmuS and ncmuL are the number of constant-multiplies in FS and FL, respectively; and nxorS and nxorL are the number of multiplies in FS and FL, respectively.

An easy analysis shows it has eigenvalues of 1, 2, and 3, meaning both the multiply and the inversion are efficient. As pointed out earlier, the present embodiment differs from the [AO] reference in that constant multiply by the g specified in equation (28) is treated as a separate category, with the result being an efficiency matrix with all eigenvalues less than 4, as seen in equation (32). If through use of table lookups, one assumes that 16-bit inversion, 8-bit multiply, 16-bit squaring, 16-bit constant multiply, and 32-bit XORing are elementary (unit effort) operations, then 32-bit effort is as follows:

TABLE 3

| 32-bit operation | effort |
|---|---|
| inversion | 30 |
| multiply | 29 |
| squaring | 4 |
| constant-multiply | 4 |
| XOR | 1 |

The efficient finite field element calculation method described above is useful in other applications as well, such as cryptography. It is also generally useful in any application in which two large sets of elements of a finite field of applicable dimension are multiplied or divided pointwise, i.e. $c[i]=b[i]*a[i]$ or $c[i]=b[i]/a[i]$. Here "applicable dimension" means $$N=2^k*Q$$

where Q is small enough so that efficient methods are known for multiplying or extended-inverting field elements of dimension Q in parallel, where the extended inverse of an element is its inverse if the element is nonzero but 0 if the element is 0. In particular, it includes the case where Q=1, since in the bit field, parallel multiplication is AND and parallel extended inverse is the identity or no-op.

The general algorithm may be implemented in hardware or software. Described in more general terms, what is disclosed is a technique of performing operations, including multiplication and, independently, constant multiplication by a certain fixed constant, as well as further useful capabilities such as inversion, on input digital signals that represent elements of a first finite field of dimension 2*N (e.g. the larger field FL in the above example) to produce output signals that represent results of the operations. For each such input digital signal, two intermediate signals are formed, each representing an element of a second finite field of dimension N (e.g. the smaller field FS in the above example). The two intermediate signals and the input signal are related by an element A of the first finite field, where A satisfies the equation $$A^2+A+g=0 \qquad (29)$$

where g is a fixed (constant) element of the second finite field such that the equation $$X^2+X+g=0 \qquad (28)$$

does not have a solution X in the second finite field. In the example above, a first input signal in the first field is expressed as yx, and the two corresponding intermediate signals are y and x, where the relationship between the input signal yx and the intermediate signals y and x is $$yx=(y*A)+x. \qquad (30)$$

Similarly, the input signals may include a second input signal vu, and the two corresponding intermediate signals v and u are related to vu by the field element A. Then, operations are performed using these intermediate signals to generate additional intermediate signals, and operations may be performed using these additional intermediate signals, where the operations include at least a constant multiply, i.e. multiply of a field element by the fixed element g. The operations must also include general multiplies (multiplies of two arbitrary field elements) and general adds, and may include inversion or squaring. The method used for constant multiply, which is by $A*g$ in the field of dimension 2*N and by g in the field of dimension N, is independent of the method used for the general multiply for the field of dimension 2*N and may be independent for the field of dimension N.

Then, using the intermediate signals so generated, output signals are formed, each representing an element of the first field (the larger field FL) that is the result an operation on one or more field elements represented by the input signals, which may be inversion, multiply, squaring, constant multiply (by the element $A*g$ in the first field), or addition. Note that addition in the larger field requires only addition in the smaller field, constant multiply requires only constant multiply and addition, and general multiply requires only general multiply, constant multiply, and addition. In addition, general multiply of size 2*N requires only three general multiplies of size N, and constant multiply of size 2*N requires only three constant multiplies of size N. From this, the better than N squared efficiency follows for all operations including inversion.

The above description is general in that the input signals, intermediate signals and output signals can be in any form, including signals existing in a processor being acted upon by the processor according to program instructions, and signals existing in hard wired logic being acted upon by the logic elements. The description is general also in that the input signals may be the result of some upstream processing and the output signals may be subject to further downstream processing, and the nature of either processing is unimportant for purposes of the methods described here.

This technique may be applied repeatedly to further extend the dimension of the field, such as to extend from the field of dimension 2*N to the field of dimension 4*N. To do this, the functions are nested, including the appropriate constant multiplies. For example, a 32-bit element may be written as (highest order byte on left)

vuyx where v, u, y, and x are bytes (from a 8-bit field) and the actual number represented is (vA+u)B+(yA+x)

where A (in the 16-bit field) and B (in the 32-bit field) satisfy $$A^2+A+g=0$$

$$B^2+B+h=0$$

where g is in the 8-bit field and $$h=A*g$$

according to the tower rules.

Figure 7:
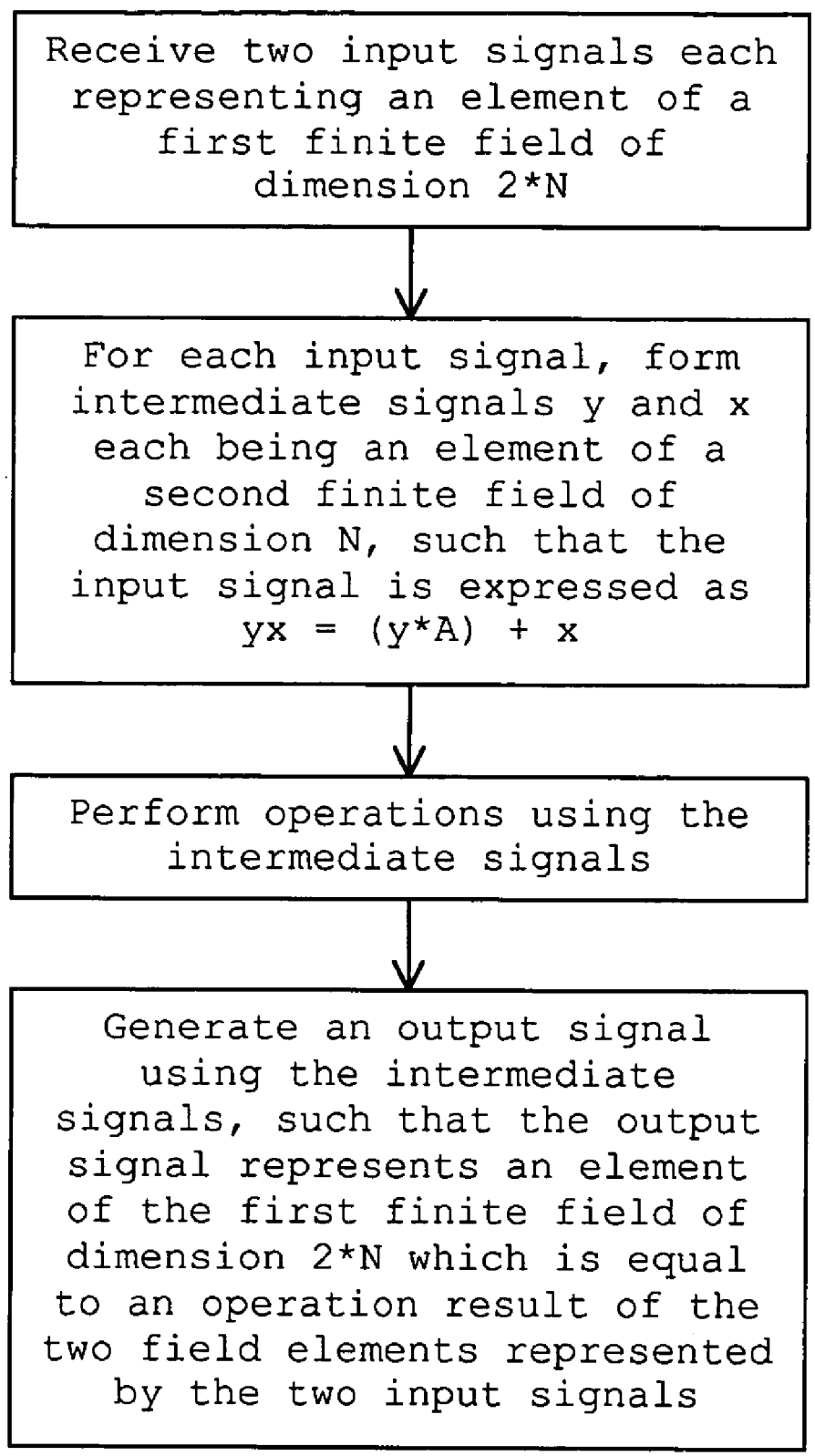
FIG. 7 is a flow chart illustrating a method for calculating finite field element products and inverses according to an embodiment of the present invention.

The flow chart in FIG. 7 illustrates the general steps of the tower coordinate method for calculating finite field element products and inverses that has been described in detail above.

The method for efficient calculation of the inverse of the square submatrices of the encoding matrix is described next. As mentioned earlier, during decoding, an inverse of a square submatrix of the encoding matrix (the inverse may be referred to as the decoding matrix) is applied to the syndromes corresponding to missing data disks and valid parity disks. The syndromes may be efficiently calculated using Horner's method described earlier. Once the decoding matrix is calculated, standard matrix multiplication software or hardware can generate the required decoded data using long XORs or other efficient techniques. As to the calculation of the inverse of the square submatrix, it is often not practical to pre-store the inverses in a table (at least for larger matrix dimension and disk count).

For calculating matrix inverses, a well-known technique is Gaussian elimination, where instance row operations are applied to

[B|I]

(B the square submatrix, I the identity matrix) to first reach

[U|L]

(U an upper triangular matrix with unit diagonal, L a lower triangular matrix), and then

[I|C]

(I the identity, C the inverse of B). If the matrix to be inverted is of dimension M, and tests, substitutions and row swaps are considered to be effortless, then one inversion using this standard Gaussian elimination technique requires

TABLE 4

| matrix dimension (M) | 2 | 3 | 4 | 5 |
|---|---|---|---|---|
| M scalar inversions | 2 | 3 | 4 | 5 |
| M(M − 1) (M + 1) multiplies | 6 | 24 | 60 | 120 |
| M(M − 1) (M − 1) XORs | 2 | 12 | 36 | 80 |
| effort (32 bit) | 236 | 798 | 1896 | 3710 |

The last row of Table 4 gives an example for a 32 bit field, where the amounts of efforts are calculated using the tower coordinate extension technique and considerations previously described (see Table 3). The finite field element calculation may also be done in the 32-bit field directly without using the tower extension technique, which may give different amounts of efforts.

The present embodiment describes an efficient method of calculating matrix inverse. Every square submatrix of the Reed-Solomon-like encoding matrix defined earlier in this disclosure (equation (3)) can be written in the form "e>f>..." where e,f, ... are an increasing sequence of integers between s and s+m−1, and "e>f>..." denotes a square matrix of form $$e > f > \ldots = \begin{pmatrix} \alpha^{ei} & \alpha^{ej} & \ldots & \ldots & \ldots \\ \alpha^{fi} & \alpha^{fj} & \ldots & \ldots & \ldots \\ \vdots & \vdots & \ldots & \ldots & \ldots \\ \vdots & \vdots & \ldots & \ldots & \ldots \\ \vdots & \vdots & \ldots & \ldots & \ldots \end{pmatrix} \quad (33)$$

for an increasing sequence i, j, ... between 0 and d−1. Here m is the redundancy, d is the data disk count, and s is an integer normally selected so that 2s+m−1 approximately equals 0 (balance). (Note that in the encoder section earlier, matrices in the form of (33) were denoted by M followed by numbers.)

In what follows, i, j, ... are treated as known and quasi-constant. The "M-th Vandermonde value" $V_M$ is defines as $$V_M = |0>1> \ldots M-1>| \quad (34)$$

and, for any size-M square matrix with e=0, the "Schur expression" S0f... is defines to be $$S0f\ldots = |0>f> \ldots |/V_M \quad (35)$$

(Note that this is not standard notation for the Schur functions.) One will see that the Schur expression is always a symmetric polynomial in $\alpha^i, \alpha^j$ ... For example, $$S023 = \alpha^{i+j} + \alpha^{i+k} + \alpha^{j+k} = \#i{:}j{:}i+k{:}j+k \quad (36)$$

where #i+j:i+k:j+k is a notation of the polynomial, with exponents of $\alpha$ separated by colons. Note here that in the polynomial expression "+" in the exponents is integer addition, while "+" between terms is XOR. All Schur expressions are symmetric polynomials in the i, j, k ... powers of $\alpha$. The following are some nontrivial Schur expressions (from standard Vandermonde 0>1>, 0>1>2>, 0>1>2>3 as the case may be) for Characteristic 2:

0>2>#i:j

0>3>#2i:i+j:2j

0>4>#3i:2i+j:i+2j:3j

0>1>3>#i:j:k

0>1>4>#2i:2j:2k:i+j:i+k:j+k

0>2>3>#i+j:i+k:j+k

0>2>4>#2i+j:2j+k:2k+i:2i+k:2j+i:2k+j

0>1>2>4>#i:j:k:l

0>1>3>4>#i+j:i+k:i+l:j+k:j+l:k+l

0>2>3>4>#i+j+k:i+j+l:i+k+l:j+k+l

Expanded, the formula for 0>2>3> above (as an example) means:

|0>2>3>|=($\alpha^{i+j}+\alpha^{i+k}+\alpha^{j+k}$)|0>1>2|

In Schur expressions, to shift up (or down) by 1, add (or subtract) i+j+ ... to (from) all exponents, thus:

−1>2>#i−j:0:j−i

0>3>#2i:i+j:2j

1>4>#3i+j:2i+2j:i+3j

They still need to be multiplied by their respective (Vandermonde) bases. Another way is to shift the Vandermonde bases (replace 0>1> with −1>0> for instance) and then use the standard Schur functions. In other words, note that in equation (35) a shift of the ef... terms both above and below by the same number leads to the same quotient. Thus, for example, $$S023 = \frac{|0>2>3|}{|0>1>2|} = \frac{|-1>1>2|}{|-1>0>1|} = \#i+j{:}i+k{:}j+k \quad (37)$$

This is because shifting all the ef... terms by +1 amounts to multiplying the determinant by $\alpha^{i+j+\ldots}$ which is nonzero and cancels top and bottom.

Due to the general expression (33), a pre-stored one-dimensional table of powers of $\alpha$ from −$L_1$d to +$L_2$d for small integers $L_1$ and $L_2$ (of the order of m) will suffice to allow inversion of (33), using Cramer's rule, for far lower cost than other known methods. For m=5, if shifting is used, the calculation of powers of α can be turned into lookups from tables of powers of α from −3 to +3 times the maximum exponent (i.e. d−1). If shifting is not used, the lookup tables have to go from −6 to +6 times this number.

According to Cramer's rule, the inverse matrix is the transpose of the matrix of minors, generated by removing the indexed row and column, divided by the (scalar) determinant of the original matrix. The sign can be ignored because this is characteristic 2. Thus, one gets $$inv(e > f > \ldots)_{JI} = \frac{|e > f > \ldots \wedge \ldots |(i, j, \ldots \wedge \ldots)}{|e > f > \ldots |(i, j, \ldots)} \quad (38)$$

where the (i, j, . . . ) are here made explicit so that one of them can be omitted (^) and also one of the ef . . . is omitted. But, both the numerator and denominator on the right of (38) are the product of a Schur expression and a shifted Vandermonde determinant, which in turn is the product of a shift term of form $$\alpha^{ei+ej+\ldots}$$

and a number of binomials of form (characteristic 2)

$$(\alpha^i + \alpha^j)$$

For the complexities of interest, the Schur expressions are short, and the Vandermonde factors tend to cancel. A single row of the inverse has the same subset of the ij . . . and can therefore be generated by Schur expressions multiplied through by the same expression, the inverse of $$Q_I = |e > f > \ldots |(i, j, \ldots) / (\alpha^{ei+ej+\ldots \wedge \ldots} V_{M-1}(i, j, \ldots \wedge \ldots)) \quad (39)$$
$$= \alpha^{ei+ej+\ldots} V_M S0f' \ldots / (\alpha^{ei+ej+\ldots \wedge \ldots} V_{M-1}(i, j, \ldots \wedge \ldots))$$

(where the I-th i, j, . . . value is omitted by ^ and f'=f−e, etc.) in which the entire denominator cancels, meaning the rational function $Q_I$ is a polynomial. This and other approaches can be used to reduce the number of multiplications and inversions at minimal cost in lookups and index calculations for the one-dimensional table.

Described below is an illustrative example for the inverse of −2>−1>0>1>2>, the only case that arises with M=5 if m=5 and s is balanced (s=−2). Again, the amount of efforts is calculated using the tower coordinate extension technique described earlier (see Table 3); if finite field element calculation is done without using the tower extension technique, the effort figures may be different.

(Step 1) Generate the Schur expression for S0f . . . corresponding to e>f> . . . ; in this case, S01234; as this will be shared by all $Q_I$ for columns of minors. In this case this is 1 and Step 1 can be omitted.

All following steps are repeated for each column of minors. The indices in the case described below will be appropriate for the last column, the one corresponding to m. In the following description of Step 2, "m" means the 5th base power of α, not the redundancy. Note that e=−2.

(Step 2) Generate the expression $$Q_I / S0f \ldots = \alpha^{eiI} V_M / V_{M-1}(i, j, \ldots \hat{} \ldots) \quad (40)$$

In this case it is $$\frac{\alpha^{-2m} V_M(i, j, k, l, m)}{V_{M-1}(i, j, k, l)} = \alpha^{-2m}(\alpha^i + \alpha^m)(\alpha^j + \alpha^m)(\alpha^k + \alpha^m) \quad (41)$$

$$(\alpha^l + \alpha^m)$$
$$= ((\alpha^i + \alpha^m)(\alpha^{j-m} + 1))$$
$$((\alpha^k + \alpha^m)(\alpha^{l-m} + 1))$$
$$= (\#i + j - m:i:j:m) * (\#k + l - m:k:l:m)$$

If one assumes that integer operations of sign change, subtraction and addition and one-dimensional table lookup are each unit effort, then the evaluation of (41) using the strategy on the bottom consists of four integer operations, eight table lookups, six XORs, and one multiply, with total effort of 47. Integer operations and table lookups are treated (like XORs) as having an effort of 1.

(Step 3) Generate the inverse of $Q_I$, by multiplying with the output of Step 1 if necessary, and inverting. In this case the multiply is not needed, and the inversion costs effort of 30.

(Step 4) Generate the row of inverse matrix entries by calculating the required Schur expression for each minor and multiplying it, if necessary, by the output of Step 3.

(a) The first minor is −1>0>1>2> and its Schur expression is S1234 which is #i+j+k+l. This calculation requires three integer operations, one lookup, and one multiply, for effort of 33.

(b) The second minor is −2>0>1>2> and its Schur expression is S0234 which (see Appendix) is #i+j+k:i+j+l:i+k+l:j+k+l, and the calculation requires eight integer operations, four lookups, three XORs, and one multiply, for effort of 44.

(c) The third minor is −>−1>1>2>, the Schur expression is S0134=#i+j:i+k:i+l:j+k:j+l:k+l for effort of 46.

(d) The fourth minor is −2>−1>0>2, Schur expression S0124=#i:j:k:l, and effort is 36.

(e) The fifth minor is −2>−1>0>1>, Schur expression S0123=1, and effort is 0.

The total effort per inverse row of Steps 2 through 4 is 236. Therefore the effort for the entire inverse calculation, including Step 1, is 1180, which is less than one third the effort using Gaussian elimination (3710, see Table 4). Note that the effort in both Table 4 and here are by using the tower coordinate technique.

To summarize, the efficient method of calculating the matrix inverse (the decoding matrix) includes pre-storing a one-dimensional table of powers of α, calculating the matrix inverse using Cramer's rule, expressing the minors using Schur expressions, and calculating the Schur expression by performing table lookup in the table of powers of α and other necessary field element operations.

The field element operations involved in the matrix inverse calculation may be performed directly in the original (powers of α) coordinates, where the powers of α are stored as bit vectors; or performed by using the tower coordinate extension technique described earlier. These different coordinates may be referred to as different mappings of the field to N-bit vectors. The mapping which is efficient for the encoding method and syndrome calculation is not necessarily efficient for arbitrary field element multiplication and especially inversion, when the field is too large for full tabulation. Thus a second mapping, such as tower coordinates, which is mathematically equivalent to the standard mapping and related to it by an N×N bit matrix multiplication and its inverse, may be desirable for the calculation of decoding matrices.

If the tower coordinate technique is used, the field elements are expressed in the tower coordinates, and the one-dimensional table of powers of α and other tables needed for efficient multiplication and inversion are stored in the tower coordinates. In the 32-bit field example, the tables may be stored in a nested fashion down to basic "shorts" of 8 bits, with 16-bit tables as described. After the decoding matrix is calculated (using the tower coordinates), a bit linear (matrix) transformation is applied to change the field element from the tower coordinates to their vector expressions in the larger field (i.e. the vector expressions used in encoding). In the 32-bit field example, this transformation requires two lookups and one XOR per decoding matrix entry, thus 75 total operations for a 5×5 decoding matrix.

To apply the decoding matrix to the syndromes, the decoding matrix entries (which are field elements) are further converted from vector expressions to matrix expressions. This requires, for the 32-bit field example, multiplying by the first 31 natural number powers of α. For a 5×5 decoding matrix, there are 25 elements that need to be converted. This can be done efficiently using the Horner approach described earlier, by indexing the field elements with the depth-wise coordinate j in the Horner's accumulator. The Horner's accumulator used for this calculation may omit the side input and side combiner (see FIG. 1). The signal on the trunk output is either switchably connected to the corresponding bit of the trunk input via a latch or connected to the trunk input of another accumulator so as to generate a sequence of products of the initial trunk input by increasing powers of $\alpha^{s+k}$, which may be successively outputted at a side output connected to the trunk output. If the 25×32 bit array is transpose addressed during the Horner method operation, with the example of α value given in Table 1 (# or ##, having three nonzero coefficients), it would require 32×31×3=2976 XOR operations at least 25 bits deep. Greater relative gains are possible with wider XOR operations, if rotational symmetry is imposed by rotating the disk indices in the RAID algorithm (like RAID5), because this requires multiple syndrome decoding patterns, most of which will be of the same dimension if d is large.

If the tower coordinate technique is used, a parallel one-dimensional table of powers of α in the original (powers of α) coordinates may be stored to efficiently handle the special case where the square submatrix of the encoding matrix is 1×1. Such a case (i.e. only one data disk is missing) is expected to be relatively common. Since each entry in the parity matrix is a power of α, so is its inverse. Thus, the 1×1 decoding matrix can be obtained by direct table lookup using this table. Such a table may be stored in either bit vector or bit matrix form. If stored in a matrix form (which is preferable), the table can also be used to convert the field element from the vector expression to the matrix expression mentioned in the preceding paragraph.

To use the decoding matrix (in bit matrix form under the powers of α mapping) to generate decoded data from syndrome data, multiplying the syndrome data by the square decoding matrix is efficiently performed by reordering the bits of the decoding matrix into a number of bit fields treated as unsigned integers. Each integer corresponds to an XOR accumulate of a subset of a set of syndrome data fields onto a subset of the decoded data. The matrix multiply is performed by looping over all of the integers. For N=32, for example, a single bit of decoded output is the dot-product of 32k bits of arbitrary syndrome input with k 32-bit columns of the fixed decoding matrix. Using K-wide XOR operations, K corresponding bits of such output are generated by XORing the results of 4k operations, each a 256-branch choice leading to an XOR sum of from 0 to 8 K-wide input bit data sets.

The result for a single RAID4-like decode, in the M=5 example given above, will be 25 matrices or 3200 bytes, which can be looped through, with each (transpose addressed) byte branching one of 256 ways to cause between 0 and 8 wide XOR accumulates on syndrome data. Most real-world decodes are expected to be less burdensome, with disk replacement taking place while only three or fewer disks are down, even in very large arrays of hundreds of disks.

Figure 6:
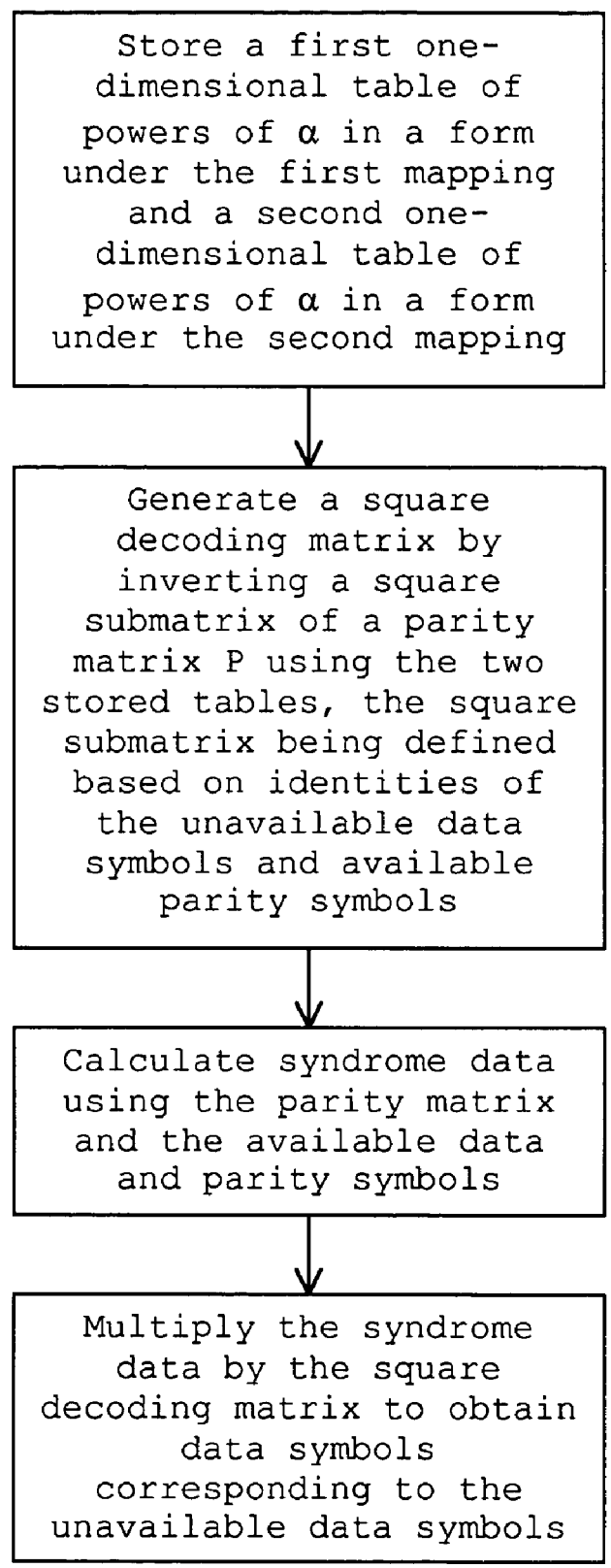
FIG. 6 is a flow chart illustrating a decoding method according to an embodiment of the present invention.

The flow chart in FIG. 6 illustrates the general steps of a decoding method that has been described in detail above. Exemplary systems in which such a method may be implemented are schematically illustrated in FIGS. 8(a) and 8(b) where FIG. 8(a) illustrates a computer system and FIG. 8(b) illustrates a data storage system. The decoding algorithm is carried out by the processor.

It will be apparent to those skilled in the art that various modification and variations can be made in the method and apparatus of the present invention without departing from the spirit or scope of the invention. For example, the encoding and decoding methods may be implemented in hardwired logic or in software/firmware, or combinations thereof. Some implementations can be accomplished by those skilled in the relevant art based on the description in this disclosure. Thus, it is intended that the present invention cover modifications and variations that come within the scope of the appended claims and their equivalents. In particular, the claims written in the "means" language are intended to broadly encompass any suitable hardware or software structures that implement the functions and their equivalents.

What is claimed is:

1. A method for encoding input data including d data symbols ($b_0, b_1, \ldots b_{d-1}$) to generate coded data having d+m symbols, each symbol consisting of N bits, where d is an integer greater than 1, m is an integer greater than 3, N is an integer greater than 1, and s is an integer, the method comprising:

(a) receiving the d data symbols;

(b) calculating m parity symbols from the d data symbols, wherein each k-th parity symbol for integer k between 0 and m−1 is calculated by evaluating a parity polynomial $$p_b(x) = \sum_{i=0}^{d-1} b_i x^i$$

at $$x = \alpha^{s+k},$$

where α is a primitive element of a finite field FN of dimension N over the bit field {0,1}, all N-bit symbols being mapped onto the field FN by a mapping which is a vector space isomorphism over {0,1} using bitwise AND and XOR operations, such that for every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN; and (c) storing or transmitting the d data symbols and the m parity symbols as the d+m symbols of the coded data.

2. The method of claim 1, where N=8, m=4 and d<=33, and α satisfies the polynomial equation in FN $\alpha^8 + \alpha^7 + \alpha^3 + \alpha^1 + 1 = 0$.

3. The method of claim 1, where N=16, m=4 and d<=255, and α satisfies the polynomial equation in FN $\alpha^{16} + \alpha^{10} + \alpha^7 + \alpha^3 + 1 = 0$.

4. The method of claim 1, where N=32, m=4 and d<=255, and α satisfies the polynomial equation in FN $\alpha^{32} + \alpha^{21} + \alpha^{20} + \alpha^{19} + 1 = 0$.

5. The method of claim 1, where N=8, m=4 and d<=33, and α satisfies the polynomial equation in FN $\alpha^8 + \alpha^4 + \alpha^3 + \alpha^1 + 1 = 0$.

6. The method of claim 1, where N=16, m=5 and d<=102, and α satisfies the polynomial equation in FN $\alpha^{16} + \alpha^{10} + \alpha^7 + \alpha^3 + 1 = 0$.

7. The method of claim 1, where N=16, m=5 and d<=120, and α satisfies the polynomial equation in FN $\alpha^{16} + \alpha^{14} + \alpha^{10} + \alpha^8 + \alpha^7 + \alpha^3 + 1 = 0$.

8. The method of claim 1, where N=32, m=5 and d<=255, and α satisfies the polynomial equation in FN $\alpha^{32} + \alpha^{21} + \alpha^{20} + \alpha^{19} + 1 = 0$.

9. The method of claim 1, where N=32, m=5 and d<=255, and α satisfies the polynomial equation in FN $\alpha^{32} + \alpha^{30} + \alpha^{23} + \alpha^{16} + 1 = 0$.

10. The method of claim 1, wherein s=−(m−1)/2 for odd m and s=−(m−2)/2 for even m.

11. The method of claim 1, wherein the step of calculating m parity symbols comprises, for each k-th parity symbol:
(a) calculating acc=$(b_{d-1}*x)+b_{d-2}$;
(b) calculating acc=$(acc*x)+b_{d-3}$;
(c) repeating step (b) using successive values $b_{d-4}$, $b_{d-5}$, ... $b_0$ in place of $b_{d-3}$ in the calculation to evaluate the parity polynomial $p_b(x) = b_0 + x(b_1 + x(b_2 + \ldots x(b_{d-1}) \ldots ))$.

12. The method of claim 1, wherein step (c) comprises: storing a different one of the d data blocks in each of d data storage devices; and
storing a different one of the m parity blocks in each of m parity storage devices.

13. The method of claim 1, wherein N is a power of 2.

14. The method of claim 13, where α satisfies an irreducible polynomial equation in FN $\alpha^N + \alpha^h + \alpha^g + \alpha^f + 1 = 0$ where f, g and h are integers satisfying 0<f<g<h<N.

15. The method of claim 14, where N=8, 16, or 32 and m=4 or 5.

16. A data encoder for encoding input data having d data blocks ($b_0, b_1, \ldots b_{d-1}$) to generate coded data having d+m blocks, each data block consisting of N*K bits, where d is an integer greater than 1, m is an integer greater than 3, N is an integer greater than 1, K is an integer greater than 0, the bits of every block being indexed by indices i,j, where $0 \leq i < N$ and $0 \leq j < K$, and where s is an integer, the encoder comprising:
means for receiving the d data blocks;
means for calculating m parity blocks from the d data blocks, wherein each k-th parity block for integer k between 0 and m−1 is calculated by evaluating a parity polynomial $$p_b(x) = \sum_{i=0}^{d-1} b_i x^i$$

at $$x = \alpha^{s+k},$$

where α is a primitive element of a finite field FN of dimension N over the bit field $\{0,1\}$, all N-bit symbols being mapped onto the field FN by a mapping which is a vector space isomorphism over $\{0,1\}$ using bitwise AND and XOR operations, such that for every integer M between 1 and min(m,d) inclusive, and every ordered subset of M−1 integers $\{i_2, \ldots i_m\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN,
wherein the means for calculating m parity blocks comprises, for each parity block, K identical copies of means for calculating N bits of the block having the same index j; and
means for storing or transmitting the d data symbols and the m parity symbols as the d+m symbols of the coded data.

17. The data encoder of claim 16, wherein N*K>32.

18. The data encoder of claim 16, wherein the means for calculating m parity blocks includes, for each k-th parity symbol, a means for calculating a variable acc $acc = (acc*x) + b_i$.

19. A data storage system comprising the data encoder of claim 16, wherein the means for storing or transmitting comprises:
d data storage devices each for storing a different one of the d data blocks; and
m parity storage devices each for storing a different one of the m parity blocks.

20. A data encoder for encoding input data including d data blocks ($b_0, b_1, \ldots b_{d-1}$) to generate coded data including m parity blocks, each data block and parity block consisting of N*K bits, where d is an integer greater than 1, m is an integer greater than 1, N is an integer greater than 1, K is an integer greater than 0, and s is an integer, the encoder comprising:
- m accumulators each for calculating one of the m parity blocks, each accumulator comprising:
- a trunk input including N*K bits logically indexed by a width-wise coordinate i and a depth-wise coordinate j, i being an integer variable between 0 and N−1 and j being an integer between 0 and K−1, the bits having the same j logically forming a j-th trunk input vector;
- a side input including N*K bits indexed by the width-wise coordinate i and the depth-wise coordinate j, the bits having the same j logically forming a j-th side input vector;
- a trunk output including N*K bits indexed by the width-wise coordinate i and the depth-wise coordinate j, the bits having the same j logically forming a j-th trunk output vector;
- for each value of j, zero or more shifts and XOR combiners forming a mapping circuit, the mapping circuit connected to the N bits of the j-th trunk input vector as input and generating as output N mapped bits logically forming a j-th mapped vector;
- for each value of j, N XOR combiners each for combining one bit of the j-th mapped vector with a corresponding bit of the j-th side input vector to generate a corresponding bit of the j-th trunk output vector;
- wherein the mapping circuits are identical for all j within each of the m accumulators,
- wherein for an integer k between 0 and m−1, the mapping circuit for the k-th one of the m accumulators generates a mapped vector capable of being expressed as a product of the trunk input vector and $x=\alpha^{s+k}$, where $\alpha$ is a primitive element of a finite field FN of dimension N over the bit field $\{0,1\}$, all N-bit symbols being mapped onto the field FN by a mapping which is a vector space isomorphism over $\{0,1\}$ using bitwise AND and XOR operations, such that for every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN.

21. The data encoder of claim 20, wherein m>3.

22. The data encoder of claim 20, wherein K*N>32.

23. The data encoder of claim 20, further comprising:
- an external input including N*K bits indexed by the width-wise coordinate i and the depth-wise coordinate j; and
- an external output including N*K bits indexed by the width-wise coordinate i and the depth-wise coordinate j,
- wherein the trunk input is selectably connected to either the trunk output or the external input, and the trunk output is selectably connected to either the trunk input or the external output.

24. The data encoder of claim 23, further comprising a controller connected to each of the m accumulators, the controller being operable on each accumulator to:
- (a) coupling data block $b_{d-1}$ to the trunk input and coupling data block $b_{d-2}$ to the side input of the accumulator, whereby a trunk output block is generated by the accumulator based on the trunk input and side input;
- (b) coupling the trunk output block thus generated to the trunk input of the accumulator and coupling the next data block $b_{d-3}$ to the side input of the accumulator, whereby new trunk output block is generated by the accumulator based on the trunk input and side input;
- (c) repeating step (b), each time using the next data block until data block $b_0$ is coupled to the side input; and
- (d) coupling the trunk output generated in step (c) to the accumulator output.

25. The data encoder of claim 24, wherein the controller is operable to perform each step simultaneously for all m accumulators.

26. A method for encoding input data having d data symbols $(b_0, b_1, \ldots b_{d-1})$ to generate coded data having d+3 symbols, each symbol consisting of N bits, where d is an integer greater than 1, and N is an integer greater than 1, the method comprising:
- (a) receiving the d data symbols;
- (b) calculating 3 parity symbols from the d data symbols, wherein each k-th parity symbol for integer k between 0 and 2 is calculated by evaluating a parity polynomial $$p_b(x) = \sum_{i=0}^{d-1} b_i x^i$$

at $$x = \alpha^{k-1},$$

where $\alpha$ is a primitive element of a finite field FN of dimension N over the bit field $\{0,1\}$, all N-bit symbols being mapped onto the field FN by a mapping which is a vector space isomorphism over $\{0,1\}$ using bitwise AND and XOR operations, a being nonzero and the order of a in the multiplicative group of FN being greater than or equal to d,

- (c) storing or transmitting the d data symbols and the 3 parity symbols as the d+3 symbols of the coded data.

27. A data encoder for encoding input data having d data blocks $(b_0, b_1, \ldots b_{d-1})$ to generate coded data having d+m blocks, each data block consisting of N*K bits, where d is an integer greater than 1, m is an integer greater than 1, N is an integer greater than 1, K is an integer greater than 0, N*K>32, the bits of every block being indexed by indices i,j, where $0 \leq i < N$ and $0 \leq j < K$, and where s is an integer, the encoder comprising:
- means for receiving the d data blocks;
- means for calculating m parity blocks from the d data blocks, wherein each k-th parity block for integer k between 0 and m−1 is calculated by evaluating a parity polynomial $$p_b(x) = \sum_{i=0}^{d-1} b_i x^i$$

at $$x = \alpha^{s+k},$$

where $\alpha$ is a primitive element of a finite field FN of dimension N over the bit field $\{0,1\}$, all N-bit symbols being mapped onto the field FN by a mapping which is a vector space isomorphism over $\{0,1\}$ using bitwise AND and XOR operations, such that for every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN, wherein the means for calculating m parity blocks comprises, for each parity block, K identical copies of means for calculating N bits of the block having the same index j; and means for storing or transmitting the d data symbols and the m parity symbols as the d+m symbols of the coded data.

28. A method for decoding data, wherein the data comprises d data symbols and m parity symbols and wherein up to a total of m data and parity symbols are unavailable, each symbol consisting of N bits, where d is an integer greater than 1, m is an integer greater than 1, N is an integer greater than 1, and s is an integer, wherein each k-th of the m parity symbols for integer k between 0 and m−1 has been calculated from the d data symbols by evaluating a parity polynomial $$p_b(x) = \sum_{i=0}^{d-1} b_i x^i$$

at $$x = \alpha^{s+k},$$

where $\alpha$ is a primitive element of a finite field FN of dimension N over the bit field $\{0,1\}$, all N-bit symbols being mapped onto the field FN by a first and a second mapping each of which is a vector space isomorphism over $\{0,1\}$ using bitwise AND and XOR operations, the first and second mapping being either the same or different mappings, such that for every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN,
the decoding method comprising:
(a) storing a first one-dimensional table of powers of $\alpha$ in a form under the first mapping and a second one-dimensional table of powers of $\alpha$ in a form under the second mapping, each table being indexed by the power to which $\alpha$ is raised, where the index ranges from an integer value by steps of 1 to a greater integer value;

(b) generating a square decoding matrix by inverting a square submatrix of a parity matrix P:

$$P = \begin{pmatrix} 1 & \alpha^s & \alpha^{2s} & \cdots & \alpha^{(d-1)s} \\ 1 & \alpha^{s+1} & \alpha^{2(s+1)} & \cdots & \alpha^{(d-1)(s+1)} \\ \vdots & \vdots & \vdots & \vdots & \vdots \\ \vdots & \vdots & \vdots & \vdots & \vdots \\ 1 & \alpha^{s+m-1} & \alpha^{2(s+m-1)} & \cdots & \alpha^{(d-1)(s+m-1)} \end{pmatrix}$$

and the square submatrix is defined based on identities of the unavailable data symbols and available parity symbols, the inverting step including:
if the square submatrix is 1×1,
(b1) obtaining a power of a from the first one-dimensional table by table lookup using an index determined by the square submatrix entry; and
if the square submatrix is 2×2 or larger,
(b2) calculating a plurality of indices based on an expression of inverse matrix entries as minors of the square submatrix of the parity matrix; and
(b3) obtaining powers of a from the second one-dimensional table by table lookup using the calculated indices;
(c) calculating syndrome data using the parity matrix and the available data and parity symbols; and
(d) multiplying the syndrome data by the square decoding matrix to obtain data symbols corresponding to the unavailable data symbols.

29. The method of claim 28, where N is a power of 2.

30. The method of claim 28, wherein the first and second mappings are different mappings,
wherein in the first one-dimensional tables the powers of $\alpha$ are stored in a bit matrix form under the first mapping, and
wherein in the second one-dimensional tables the powers of $\alpha$ are stored in a bit vector form under the second mapping;
wherein step (b) further comprises:
if the square submatrix is 2×2 or larger,
(b4) converting each entry of the square decoding matrix into a bit matrix form under the first mapping.

31. The decoding method of claim 28, wherein the first and second mappings are different mappings,
wherein multiplication and inversion under the second mapping are performed as combinations of addition, multiplication, inversion, squaring, and constant multiplication on one or more subfields of FN, and
wherein the decoding method further comprises storing tables of products and inverses in the one or more subfields of FN.

32. The method of claim 28, wherein the first one-dimensional table of powers of $\alpha$ is stored in a bit matrix form under the first mapping.

33. The method of claim 28, wherein the first and second mappings are the same mapping.

34. The decoding method of claim 28, wherein step (d) includes reordering the bits of the decoding matrix into a number of bit fields treated as unsigned integers, each integer corresponding to an XOR accumulate of a subset of a set of syndrome data fields onto a subset of the decoded data; and performing matrix multiply by looping over all of the integers.

35. A data decoder for decoding data, wherein the data comprises d data symbols and m parity symbols and wherein up to a total of m data and parity symbols are unavailable, each symbol consisting of N bits, where d is an integer greater than 1, m is an integer greater than 1, N is an integer greater than 1, and s is an integer, wherein each k-th of the m parity symbols for integer k between 0 and m−1 has been calculated from the d data symbols by evaluating a parity polynomial $$p_b(x) = \sum_{i=0}^{d-1} b_i x^i$$

at $$x = \alpha^{s+k},$$

where $\alpha$ is a primitive element of a finite field FN of dimension N over the bit field $\{0,1\}$, all N-bit symbols being mapped onto the field FN by a first and a second mapping each of which is a vector space isomorphism over $\{0,1\}$ using bitwise AND and XOR operations, the first and second mapping being either the same or different mappings, such that for every integer M between 1 and min(m,d) inclusive, and every ordered subset of M−1 integers $\{i_2, \ldots i_M\}$ between 1 and d−1, and every ordered subset of M−1 integers $\{j_2, \ldots j_M\}$ between 1 and m−1, the determinant of the matrix $$\begin{pmatrix} 1 & 1 & \cdots & 1 \\ 1 & \alpha^{i_2 j_2} & \cdots & \alpha^{i_M j_2} \\ \vdots & \vdots & \cdots & \vdots \\ \vdots & \vdots & \cdots & \vdots \\ 1 & \alpha^{i_2 j_M} & \cdots & \alpha^{i_M j_M} \end{pmatrix}$$

is nonzero in the field FN,
the decoder comprising:
a memory storing a first one-dimensional table of powers of $\alpha$ in a form under the first mapping and a second one-dimensional table of powers of $\alpha$ in a form under the second mapping, each table being indexed by the power to which $\alpha$ is raised, where the index ranges from an integer value by steps of 1 to a greater integer value,
means for generating a square decoding matrix by inverting a square submatrix of a parity matrix P:

$$P = \begin{pmatrix} 1 & \alpha^s & \alpha^{2s} & \cdots & \alpha^{(d-1)s} \\ 1 & \alpha^{s+1} & \alpha^{2(s+1)} & \cdots & \alpha^{(d-1)(s+1)} \\ \vdots & \vdots & \vdots & & \vdots \\ \vdots & \vdots & \vdots & \vdots & \vdots \\ 1 & \alpha^{s+m-1} & \alpha^{2(s+m-1)} & \cdots & \alpha^{(d-1)(s+m-1)} \end{pmatrix}$$

and the square submatrix is defined based on identities of the unavailable data symbols and available parity symbols, the means for generating:
for a 1×1 square submatrix,
    means for obtaining a power of $\alpha$ from the first one-dimensional table by table lookup using an index determined by the square submatrix entry; and
for a 2×2 or larger square submatrix,
    means for calculating a plurality of indices based on an expression of inverse matrix entries as minors of the square submatrix of the parity matrix; and
    means for obtaining powers of $\alpha$ from the second one-dimensional table by table lookup using the calculated indices;
means for calculating syndrome data using the parity matrix and the available data and parity symbols; and
means for multiplying the syndrome data by the square decoding matrix to obtain data symbols corresponding to the unavailable data symbols.

36. The decoder of claim 35, where N is a power of 2.

37. The decoder of claim 35, wherein the first and second mappings are different mappings,
    wherein in the first one-dimensional tables the powers of $\alpha$ are stored in a bit matrix form under the first mapping, and
    wherein in the second one-dimensional tables the powers of $\alpha$ are stored in a bit vector form under the second mapping;
    wherein the means for generating a square decoding matrix further comprises:
    for the 2×2 or larger square submatrix, means for converting each entry of the square decoding matrix into a bit matrix form under the first mapping.

38. The data decoder of claim 37, wherein the means for converting includes at least one accumulator, each accumulator comprising:
    a trunk input including N*D bits logically indexed by a width-wise coordinate i and a depth-wise coordinate j, i being an integer variable between 0 and N−1 and j being an integer between 0 and D−1, the bits having the same j logically forming a j-th trunk input vector, wherein D is the count of matrix entries handled in a single calculation;
    a trunk output including N*D bits indexed by the width-wise coordinate i and the depth-wise coordinate j, the bits having the same j logically forming a j-th trunk output vector;
    a side output including N*D bits each connected to the corresponding bits of the trunk output; and
    for each value of j, zero or more shifts and XOR combiners forming a mapping circuit, the mapping circuit connected to the N bits of the j-th trunk input vector as input and generating as output N mapped bits logically forming the j-th trunk output vector, wherein the j-th trunk output vector is capable of being expressed as a product of the trunk input vector and $x=\alpha^{s+k}$;
    wherein in at least one accumulator, each bit of the trunk output is switchably connected to the corresponding bit of the trunk input via a latch, or connected to a corresponding bit of a trunk input of another accumulator.

39. A method of processing input digital signals, wherein the digital signals include one or more input signals each representing an element of a first finite field of dimension 2*N, the method comprising:
    (a) for each of the input signals, forming a first and a second intermediate signal representing a first and a second element respectively of a second finite field of dimension N, such that the field element represented by the input signal is the sum of the second element of the second field and the product of the first element of the second field with a constant element A of the first finite field, wherein A satisfies the equation $$A^2 + A + g = 0$$

where g is a constant element of the second finite field such that the equation $X^2+X+g=0$ does not have a solution X in the second finite field;
(b) performing operations using the intermediate signals formed in step (a), including:
  (b1) performing operations using the intermediate signals from step (a) to generate first additional intermediate signals, and
  (b2) performing operations using the intermediate signals from step (a) or (b1) to generate further additional intermediate signals,
  the operations in steps (b1) and (b2) including a general add which forms the field sum of two intermediate signals, a general multiply which forms the field product of two intermediate signals, or a g-multiply which forms the field product of one intermediate signal with the constant element g; and
(c) generating an output signal representing an element of the first finite field using intermediate signals formed in step (a) or step (b) such that the field element represented by the output signal is the field product of two field elements represented by two input signals or the field product of an field element represented by an input signal with the constant field element A*g,
wherein if in step (c) the field element represented by the output signal is the field product of two field elements represented by two input signals, then step (b) includes performing zero or more general adds, one or more g-multiplies, and no more than three general multiplies, and
if in step (c) the field element represented by the output signal is the field product of one field element represented by an input signal with the constant field element A*g, then step (b) includes performing zero general multiplies, zero or more general adds, and no more than three g-multiplies.

* * * * *